United States Patent [19]
Hense et al.

[11] Patent Number: 5,767,702
[45] Date of Patent: Jun. 16, 1998

[54] SWITCHED PULL DOWN EMITTER COUPLED LOGIC CIRCUITS

[75] Inventors: Karl R. Hense, Los Altos; Robert W. Donner, Scotts Valley; Douglas W. Gorgen; Jerome D. Harr, both of San Jose, all of Calif.; Shoichi Shimizu, Fujisawa, Japan

[73] Assignee: Kabushiki Kaisha Toshiba, Kawasaki, Japan

[21] Appl. No.: 660,237

[22] Filed: Jun. 7, 1996

[51] Int. Cl.$^6$ .................... H03K 19/086; H03K 19/013
[52] U.S. Cl. .................... 326/126; 326/18; 326/26
[58] Field of Search .................... 326/126–127, 326/18, 22, 26, 29; 327/170, 205

[56] References Cited

U.S. PATENT DOCUMENTS

| | | |
|---|---|---|
| 4,276,485 | 6/1981 | Rydval .................... 326/126 |
| 4,593,211 | 6/1986 | Belforte .................... 326/126 |
| 4,754,171 | 6/1988 | Dasai et al. .................... 326/126 |
| 4,939,393 | 7/1990 | Petty . | |
| 4,943,741 | 7/1990 | Estrada et al. .................... 326/126 |
| 5,073,728 | 12/1991 | Ovens . | |
| 5,602,498 | 2/1997 | Satoh et al. .................... 326/126 |

*Primary Examiner*—Jon Santamauro
*Attorney, Agent, or Firm*—Limbach & Limbach LLP; Ronald L. Yin

[57] ABSTRACT

Switched pull down (SPD) ECL circuits have a switching circuit within the pull down portion of the output stage, so that a large portion of the total pull down current is switched to the negative going output node, and so that a small portion of the total pull down current is switched to the positive going output node. The negative going output node has a larger that normal ECL pull down current attached to it. The larger pull down current on the negative going node discharges the output capacitor in a shorter period of time. The shorter discharge time of negative going output results in a shorter fall delay time. Two smaller current sources are connected to each of the two differential ECL outputs to insure that both pull up transistors are forward biased so as to provide an adequate noise margin and insure correct circuit operation. Forward biasing the pull up transistors with a minimum acceptable amount of bias current at the emitters of the output pull up transistors provides proper immunity to noise.

22 Claims, 15 Drawing Sheets

SWITCHED PULL DOWN (SPD) USING AN OUTPUT COUPLED SWITCHING CIRCUIT

SWITCHED PULL DOWN EMITTER COUPLED LOGIC CIRCUITS

BACKGROUND OF THE INVENTION

1. Field of the Invention

The present invention relates to the field of emitter coupled logic (ECL) output circuits, and involves a switched pull down current source. Specifically, the present invention increases performance of ECL circuits by reducing the fall delay time without increasing power consumption. Simultaneous pull down and pull up current switching is performed. Output voltage swing adjustment circuits are implemented.

2. Discussion of the Related Art

The present invention, Switched Pull Down (SPD), applies to Emitter Coupled Logic (ECL) circuits. FIG. 1 shows a circuit schematic for a typical Emitter Coupled Logic (ECL) circuit. The logic function shown in FIG. 1 is a single input inverter. The logic function portion of the circuit of FIG. 1 consists of current source J1, resistors R1 and R2, and transistors Q1 and Q2. These components connected as shown in FIG. 1 make up a standard ECL differential amplifier logic stage.

The output stage portion of the circuit of FIG. 1 has two complementary outputs and consists of current sources J2 and J3 and transistors Q3 and Q4. Current sources J2 and J3 are pull down current sources, because they are designed to pull load capacitors C1 and C2, respectively, down to a voltage representative of a low logic level when the corresponding pull up transistor is not activated. Transistors Q3 and Q4 are pull up transistors, because they are configured to pull load capacitors C1 and C2, respectively, up to a voltage representative of a high logic level when necessary. Nodes 3 and 4 are the complementary output nodes of the ECL circuit.

Although the circuit shown in FIG. 1 is a single input inverter, a multiple input gate can be implemented by connecting other input transistors in parallel to transistor Q1, so that the additional transistors' collectors and emitters are connected to the same nodes as the collector and emitter of transistor Q1, while the bases of the additional transistors become the other inputs of the gate.

Load capacitors C1 and C2 are attached to the outputs nodes 3 and 4. The positive terminals of capacitors C1 and C2 are connected to the output nodes 3 and 4, while the negative terminals are typically connected to the negative supply voltage. These capacitances C1 and C2 are used to model the total capacitance of all the wiring, devices, and other capacitances that are typically attached to the outputs of an ECL logic stage.

The load capacitors C1 and C2 are charged by emitter-follower output transistors Q3 and Q4, and these capacitors are discharged by pull down currents I2 and I3 from current sources J2 and J3, respectively. Because the pull down current sources J2 and J3 are always drawing current, the pull up transistors Q3 and Q4 must be sized large enough such that they can overcome the constant pull down current when they are called upon to charge the output node and its corresponding load capacitor.

If the capacitances of capacitors C1 and C2 are sufficiently small, and the currents from the current sources J2 and J3 are sufficiently large, then capacitors C1 and C2 will be charged and discharged quickly, and the rise delay time will be approximately equal to the fall delay time. However, if the capacitance values of capacitor C1 or capacitor C2 are sufficiently large, or the currents from the current sources J2 or J3 are sufficiently small, then the discharge time of capacitors C1 and C2 becomes large in comparison to the charging time of those capacitors. Under these circumstances, the fall delay time is significantly larger than the rise delay time, as illustrated in FIG. 2.

FIG. 2 shows the typical voltage waveforms for the standard ECL circuit of FIG. 1. For simplicity of illustration and explanation, the following assumptions and approximations are made: a single $V_{be}$ voltage drop (voltage between base and emitter of a forward-biased transistor) is equal to 0.8 volts; a positive ECL output voltage level is one $V_{be}$ drop below ground (−0.8 Volts); and a negative ECL output voltage level is two $V_{be}$ drops below ground (−1.6 Volts).

The waveforms illustrated in FIG. 2 (and many of the subsequent waveforms shown in later Figures), show the operation for a positive going input signal transition only. A similar set of waveforms would result if the input signal were to be negative going: the traces for V1 and V2 would be interchanged while the traces for V3 and V4 would be interchanged. However, ECL circuit operation is well known to those familiar with the art, and it is therefore unnecessary to show both operations.

The output fall delay time is measured as the time required for the output to be pulled down to a voltage level midway (50%) between the high ECL output voltage level and the low ECL output voltage level, as illustrated by the dotted line in FIG. 2. This output fall delay time is considerably larger than the output rise delay time, which is measured as the time required for the output to be pulled up to the voltage level midway (50%) between the high ECL output voltage level and the low ECL output voltage level. This asymmetry in the rise and fall times is a typical operating condition for standard ECL circuits, and the larger fall delay time is the primary limiting constraint which sets the upper bound on the frequency of operation for ECL circuits.

When the input voltage Vin crosses the reference voltage VBB1 at time T1 shown in FIG. 2, transistor Q1 is switched on, and transistor Q2 is switched off. The voltage waveforms resulting at the collectors of transistors Q1 and Q2 are illustrated as traces labeled V1 and V2, respectively, in FIG. 2. As illustrated in FIG. 2, at time T1, node voltages V1 and V2 change from their previous voltages to their final voltages as decaying exponential traces varying with exp (−t/tau). The RC time constant, tau, of these waveforms is determined by the values of resistor R1 and resistor R2 and the total capacitances present at each of nodes 1 and 2. In FIG. 2, the time constants are shown as equal.

The output voltage waveforms are illustrated as traces V3 and V4 in FIG. 2. The positive going waveform is shown as V4, and is connected to load capacitor C2. At time T1, load capacitor C2 begins being charged through the emitter follower pull up transistor Q4, which is turned on hard and begins rapidly charging load capacitor C2. The rise delay time of the positive going waveform is measured at the 50% level (when it crosses VBB1) and is shown as T2 in FIG. 2. The negative going waveform is shown as V3 and is connected to load capacitor C1. Capacitor C1 is discharged relatively slowly by the pull down current source J2 beginning at time T1. The relatively slow discharge of capacitor C1 causes the fall delay time to be long. The fall delay time is measured at the 50% level (when it crosses VBB1) and is shown as T3 in FIG. 2.

This long fall delay time is the primary design constraint which limits the speed of ECL circuits. This constraining fall delay time can be reduced by increasing the pull down current of current source J2. However, because the constant current source J2 is always conducting, increasing its constant current also increases the power consumption of the circuit. Moreover, increasing the constant pull down current in a standard ECL output stage increases the rise delay time (unless the pull up transistors are made larger), because the pull up transistors must overcome the larger pull down current sources.

As is evidenced from the foregoing discussion, it is desirable to reduce the fall delay time of an ECL circuit without increasing the power consumption. Conversely, it is desirable to reduce the power consumption without increasing the fall delay time.

FIG. 7 of U.S. Pat. No. 4,276,485 to P. Rydval (hereinafter "Rydval") appears to show an output-coupled switch having two level-shifting diodes which prevent the pull down current switch transistors T5 and T6 from saturating. However, Rydval's output stage includes only one current source.

U.S. Pat. No. 4,943,741 to Estrada et al. in FIG. 2 (hereinafter "Estrada") appears to use blocking diodes D1 and D4 in conjunction with an alternative set of outputs at the collectors of transistors Q5 and Q6. These blocking diodes D1 and D4 will reduce the collector voltages of the pull down current switch transistors Q5 and Q6 by one forward biased diode voltage, resulting in a small enough collector-emitter voltage so that transistors Q5 and Q6 will saturate during the normal course of operation if standard ECL voltage swings (700 mv) are used.

SUMMARY OF THE INVENTION

In ECL circuits, the fall delay time is typically the speed limiting specification. It is desirable to decrease fall delay time without increasing power consumption. The present invention reduces the fall delay time of an ECL circuit without increasing the power dissipation of the circuit. Conversely, the present invention reduces the power dissipation of ECL circuits without increasing the fall delay time.

The present invention involves Switched Pull Down (SPD) circuits which have a switching circuit within the pull down portion of the output stage, so that a large portion of the total pull down current is switched to the negative going output node, with a small portion of the total pull down current switched to the positive going output node.

The negative going output node will have a larger than normal ECL pull down current attached to it. This larger than normal pull down current discharges the load capacitance for the negative going output node in a shorter period of time than a standard ECL pull down stage but uses the same amount of current in order to do so. The shorter discharge time of the negative going output results in a shorter fall delay time according to the present invention.

According to the present invention, forward biasing the pull up transistors with a minimum acceptable amount of bias current at the emitters of the output transistors provides proper immunity to noise.

The output stage can be modified to accommodate a Simultaneous Switched Pull Down (SSPD) circuit concept, in which, the logic circuit and switching circuit are logically equivalent to one another, the switching circuit inputs are connected to the same logical inputs as the logic function inputs, and the logic circuits and switching circuits will switch simultaneously or at approximately the same time.

The switched pull down output fall delay time is approximately half of what it would be for a standard ECL circuit because the pull down current for the switched pull down circuit is approximately twice as strong as that of the ECL circuit.

In the eighth embodiment as discussed hereafter, the power dissipated in this circuit is proportional to the integral of current over time. The total power dissipated is directly related to the output duty cycle. Power dissipation is minimized when the pull down period of time is less than the pull up period of time.

The present invention has several aspects which are illustrated by the ten embodiments presented in the Detailed Description of the Invention. All aspects of the present invention involve switched pull down emitter-coupled logic (ECL) output stages.

The most general description of the present invention uses a relatively large pull down current source which is switched between complementary ECL outputs so as to rapidly discharge the negative going output. Two smaller current sources are connected to each of the two differential ECL outputs to insure that both pull up transistors are forward biased so as to provide an adequate noise margin and insure correct circuit operation. The use of one switched pull down current source with two smaller pull down current sources for an ECL output stage is Switched Pull Down (SPD) according to the present invention.

According to embodiments of the present invention, the switching of the pull down current is performed simultaneously with the control of the pull up transistors. These embodiments (Simultaneously Switched Pull Down SSPD) minimize fall time of negative going ECL output signals.

Other aspects of the present invention include the voltage level and swing adjust circuits used in the ECL logic stages in conjunction with the Switched Pull Down output circuits to produce standard ECL output levels.

All the embodiments of the present invention can be implemented with single-ended control of the pull down current switch. Single-ended control has the same performance with less cost.

The features, aspects, and embodiments of the present invention are demonstrated by way of example by ten illustrative embodiments in no particular order.

The first embodiment described is switched pull down using a differential switching circuit. The second embodiment described is switched pull down using a single ended switching circuit. The third embodiment described is switched pull down using an output coupled switching circuit. The fourth embodiment described is simultaneously switched pull down (SSPD). The fifth embodiment described is any type of switched pull down with current sources for output level and swing adjustment. The sixth embodiment described is any type of switched pull down with a resistor between differential ECL collector nodes for output level and swing adjustment. The seventh embodiment described is any type of switched pull down circuit with an ECL logic stage shared resistor for output level and swing adjustment. The eighth embodiment described is a single-ended output switched pull down circuit. The ninth embodiment described is a single-ended output switched pull down circuit using a latch to control the pull down current source. The tenth embodiment described is a single-ended switched pull down circuit using a one-shot to control the switched pull down current source.

These embodiments are shown merely by way of example. These and other features, aspects, and advantages of the various embodiments of the present invention are apparent from the Detailed Description of the Invention with reference to the Figures.

BRIEF DESCRIPTION OF THE DRAWINGS

FIG. 2 shows the single-ended input, the differential outputs, and two internal node voltages during a typical operation when the input changes from low to high.

FIG. 4 shows the single-ended input, the differential outputs, and two internal node voltages during a typical operation when the input changes from low to high.

FIG. 6 shows the single-ended input, the differential outputs, and four internal node voltages during a typical operation when the input changes from low to high.

FIG. 8 shows the single-ended input, the differential outputs, and three internal node voltages during a typical operation when the input changes from low to high.

FIG. 10 shows the single-ended input, the differential outputs, and four internal node voltages during a typical operation when the input changes from low to high.

FIG. 12 shows the single-ended input, the differential outputs, and four internal node voltages during a typical operation when the input changes from low to high.

The Figures are more fully explained in the Detailed Description of the Invention.

DETAILED DESCRIPTION OF THE INVENTION

The present invention reduces the fall delay time of an ECL circuit without increasing the power dissipation of the circuit. Conversely, the present invention reduces the power dissipation of ECL circuits without increasing the fall delay time.

One well known measure of logic circuit performance is the speed-power product, which is calculated by multiplying the circuit propagation delay time (fall delay time) by the circuit power dissipation. Smaller speed-power products indicate better circuit performance than larger speed-power products. The present invention reduces and thus improves the speed-power product for ECL logic circuits.

Figure 3:
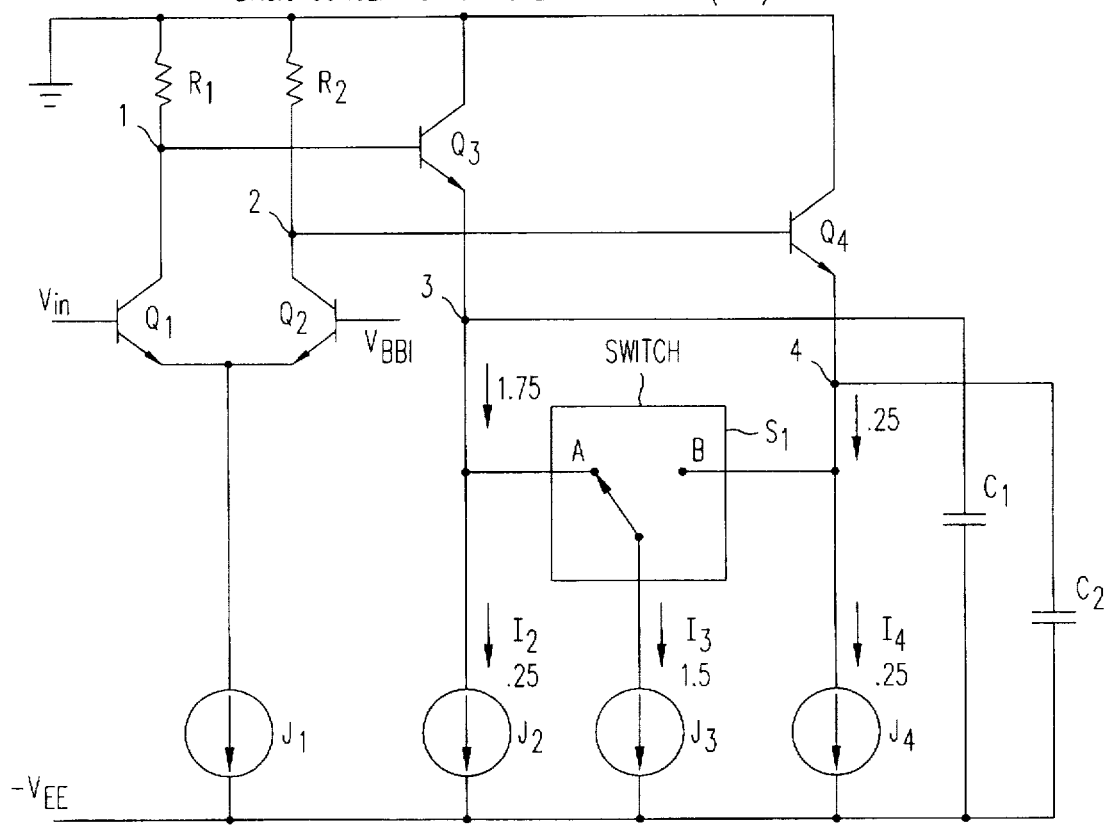
FIG. 3 illustrates a Switched Pull Down output stage according to the present invention connected to a single-ended ECL gate.

FIG. 3 illustrates the basic concept of Switched Pull Down (SPD) technology. The logic function implemented by the circuit shown in FIG. 3 is the same as the logic function implemented by the prior art ECL circuit shown in FIG. 1. Thus, the circuit shown in FIG. 3 has a logic stage which consists of the following components: current source J1, resistor R1, resistor R2, transistor Q1, and transistor Q2.

Figure 1:
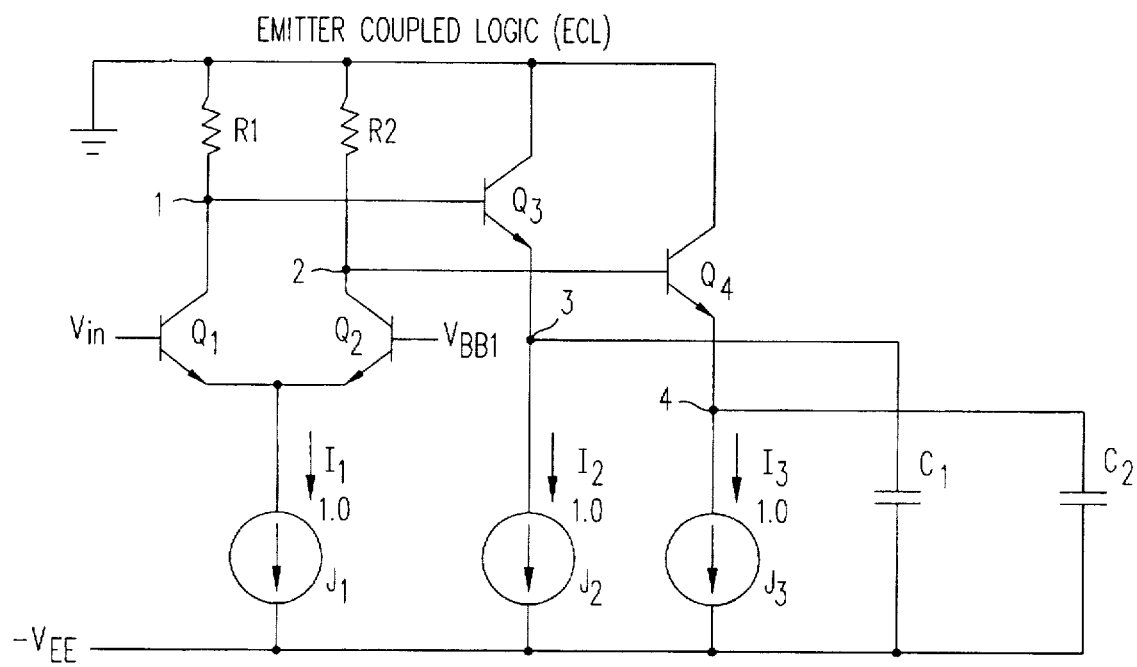
FIG. 1 illustrates a typical prior art Emitter Coupled Logic (ECL) circuit having a single-ended input and a differential output.

However, the output stage of the circuit of FIG. 3 is modified (from the circuit shown in FIG. 1) to accommodate the Switched Pull Down (SPD) circuit concept according to the present invention. The two standard ECL pull down current sources J2 and J3 in FIG. 1 are replaced by three current sources J2, J3, and J4 in FIG. 3. Current switch S1 is added in order to switch current from pull down current source J3 to either of the two output nodes 3 or 4. Emitter follower transistors Q3 and Q4 serve as pull up transistors.

The present invention involves Switched Pull Down (SPD) circuits which have a switching circuit within the pull down portion of the output stage, so that a large portion of the total pull down current is switched to the negative going output node, and so that a small portion of the total pull down current is switched to the positive going output node.

The negative going output node will have a larger than normal ECL pull down current attached to it. This larger than normal pull down current discharges the load capacitance for the negative going output node in a shorter period of time than a standard ECL pull down stage. However, collectively the total current is the same as the total current for the ECL circuit of the prior art. The shorter discharge time of the negative going output results in a shorter fall delay time according to the present invention.

Moreover, the positive going output will have a smaller than normal ECL pull down current, because most of the current was switched to the negative going output. This smaller pull down current for the positive going output allows its pull up transistor to charge up the load capacitance in a shorter period of time than standard ECL. The shorter charging time of the positive going output will result in a shorter rise delay time according to the present invention.

The current switch S1 is arranged such that it will switch the current I3 from switched pull down current source J3 to whichever output is the negative going output. Because the ECL outputs are complementary in nature, one output is always negative. In FIG. 3, the negative going output is node 3 and has two pull down currents (I2 plus I3) originating from current sources J2 and J3. The positive going output node 4 has only one pull down current I4 which originates from current source J4.

In the presently preferred embodiments, current sources J2 and J4 have approximately 0.25 units of current each. Current sources J2 and J4 in FIG. 3 are pull down current sources. The current source J3 has approximately 1.50 units of current, and is a switched pull down current source. The total pull down current on the negative going output (I2 plus I3 in FIG. 3) is equal to 1.75 units of current. This total pull down current according to the present invention is larger than the conventional ECL circuit pull down current shown in FIG. 1 which is 1.0 unit of current. The load capacitor C1 will be discharged 1.75 times faster by the SPD circuit according to the present invention than by the conventional ECL circuit shown in FIG. 1. This faster discharge of the load capacitor due to switching the pull down current according to the present invention reduces the fall delay time by a factor of approximately 1.75, and thus improves the speed-limiting specification of the fall delay time.

The total power consumption of the Switched Pull Down circuit shown in FIG. 3 according to the present invention equals the total power consumption of standard ECL output circuits such as shown in FIG. 1. The power consumption of the circuits shown in FIGS. 1 and 3 is the same because the total pull down current of the two circuits are the same. Both output stages shown in FIGS. 1 and 3 consume 2.0 units of current.

The switched pull down circuit of FIG. 3 according to the present invention recognizes when and where large and small currents are needed. It directs the large pull down current to the negative going output (where it is needed most); and it directs the small pull down current to the positive going output (where a large current is needed least).

Figure 4:
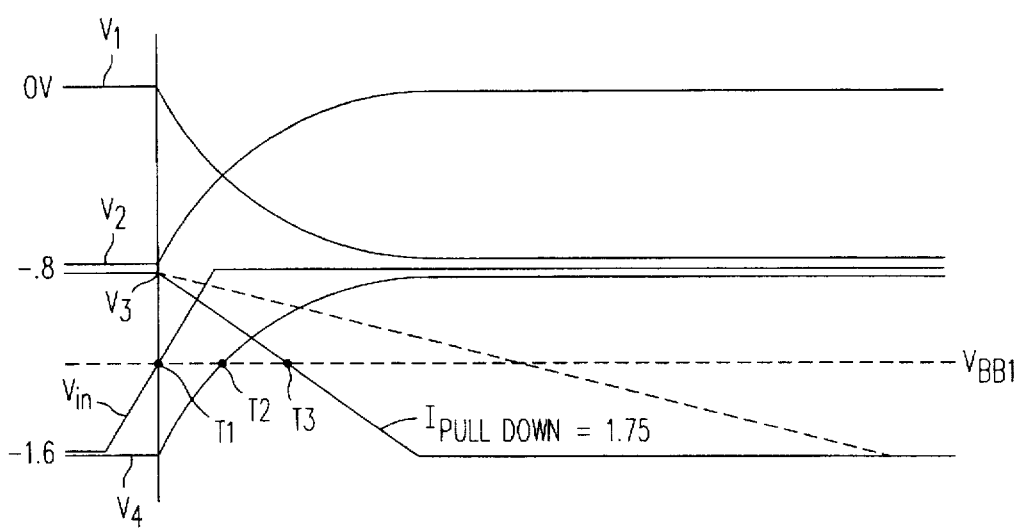
FIG. 4 is a voltage versus time plot of various node voltages of the circuit according to the present invention shown in FIG. 3.

FIG. 4 shows the voltage waveforms for the switched pull down circuit according to the present invention illustrated in FIG. 3. Transistor pairs Q1 and Q2 switch when the input voltage Vin crosses the reference voltage VBB1 at time T1. Ideally, VBB1 is set midway between the extremes of the swing of Vin. For ECL operation, VBB1 is set midway between one and two forward biased diode drops below ground.

In FIG. 4, traces V1 and V2 show the voltage waveforms at the collectors of transistor Q1 and transistor Q2, respectively. The positive going output waveform is shown as V4. Capacitor C2 gets charged quickly through emitter follower transistor Q4. The rise delay time is shown as T2. The negative going output voltage waveform according to the present invention is shown as trace V3. The negative slope of this switched pull down waveform is 1.75 times steeper than the standard ECL slope (illustrated by a dotted line) because the switched pull down current is 1.75 times greater according to the circuit of FIG. 3 rather than the standard ECL pull down current.

Figure 2:
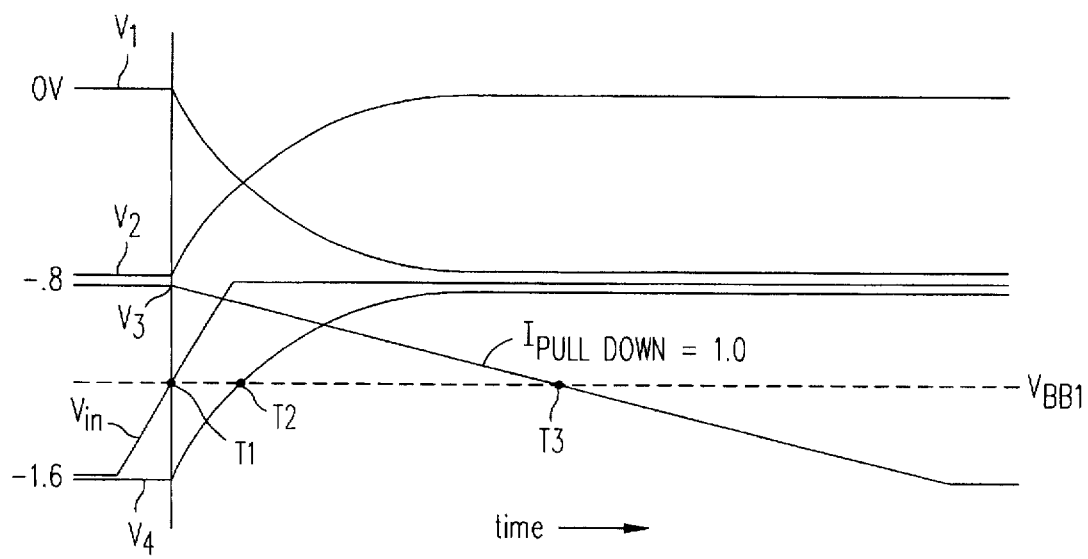
FIG. 2 is a voltage versus time plot of various node voltages of the prior art ECL circuit shown in FIG. 1.

As illustrated in FIG. 4, the fall delay time T3 for the switched pull down circuit of FIG. 3 is almost half that of the ECL circuit of FIG. 1. In FIG. 4, the dotted line shows the original ECL circuit slope from FIG. 2, and is shown for reference only in FIG. 4. It should be noted that all the drawings in FIG. 4 and throughout the application are only approximations.

The following are comparisons between the switched pull down circuit shown in FIG. 3 according to the present invention (SPD) and standard ECL shown in FIG. 1.

The ratio of SPD to ECL speed is proportional to the ratio of the SPD to ECL pull down currents.

$$\frac{SPD \text{ speed}}{ECL \text{ speed}} = \frac{SPD \text{ pull down current}}{ECL \text{ pull down current}}$$

$$\frac{SPD \text{ speed}}{ECL \text{ speed}} = \frac{1.75}{1.00} = 1.75$$

The SPD circuit is 1.75 times faster than the ECL circuit while using the same power.

The ratio of SPD to ECL fall delay times will be inversely proportional to the ratio of the ECL to SPD pull down currents.

$$\frac{SPD \text{ fall delay time}}{ECL \text{ fall delay time}} = \frac{ECL \text{ pull down current}}{SPD \text{ pull down current}}$$

$$\frac{SPD \text{ fall delay time}}{ECL \text{ fall delay time}} = \frac{1.00}{1.75} = 0.57$$

The fall delay time of the SPD circuit is 0.57 times that of the ECL circuit.

The ratio of SPD to ECL Speed*Power products may be expressed as the following.

$$\frac{SPD \text{ Speed*Power Product}}{ECL \text{ Speed*Power Product}} =$$

$$\frac{SPD \text{ fall delay time * } SPD \text{ power dissipation}}{ECL \text{ fall delay time * } ECL \text{ power dissipation}}$$

If it is assumed that for both the ECL and SPD circuits that the logic sections consume 1.0 units of current, the output stages consume 2.0 units of current, and the power supply voltage is −5.2 volts, then the following equations hold.

$$\frac{SPD \text{ Speed*Power Product}}{ECL \text{ Speed*Power Product}} =$$

$$\frac{SPD \text{ fall delay time * } (I1 + I2 + I3 + I4) * VEE}{ECL \text{ fall delay time * } (I1 + I2 + I3) * VEE} =$$

$$= \frac{0.57 * (1.00 + 0.25 + 1.50 + 0.25) * (-5.2)}{1.00 * (1.00 + 1.00 + 1.00) * (-5.2)}$$

$$= 0.57$$

The Speed*Power Product of the SPD circuit is 0.57 times the ECL Speed*Power product. The performance of the SPD circuit is therefore 1.75 times superior to that of the ECL circuit.

The circuit designer has a choice in proportioning the sizes of the currents used in the current sources J2, J3, and J4. Logic circuits must function properly under noisy conditions. An acceptable margin for noise is insured in standard ECL and in SPD by maintaining low output impedance of the output driver circuits. According to the present invention, forward biasing the pull up transistors with a minimum acceptable amount of bias current at the emitters of the output transistors provides proper immunity to noise. This pull down current is supplied by the current source J2 and J4 current sources, and it prevents the pull up transistors Q3 and Q4 from cutting off. The appropriate design choice of the currents J2 and J4 is determined by the actual noise margin requirements in the specification of a particular design application.

In switched pull down circuits according to the present invention, it is desirable to switch a large amount of pull down current to the negative going output to improve performance as measured by the Speed*Power product. The choice of current source J3 will be determined by the choice of total current chosen, and the amount of current required by current sources J2 and J4. The total pull down current will be equal to the sum of the currents through one of J2 and J4 added to J3. The final choice for the amount of current through J3 is a compromise between the positive going output's pull down current, the negative going output's pull down current, and the total pull down current.

In the example of the circuit of FIG. 3, a ratio of 0.25 to 1.75 was chosen for the respective pull down currents going to the positive and negative going outputs. This is the ratio chosen for the presently preferred embodiments of the present invention, although the ratio can be greater or less without departing from the spirit and scope of the present invention. In fact, it is expected that in practice, widely differing ratios would be chosen by designers depending upon circuit circumstances.

Figure 5:
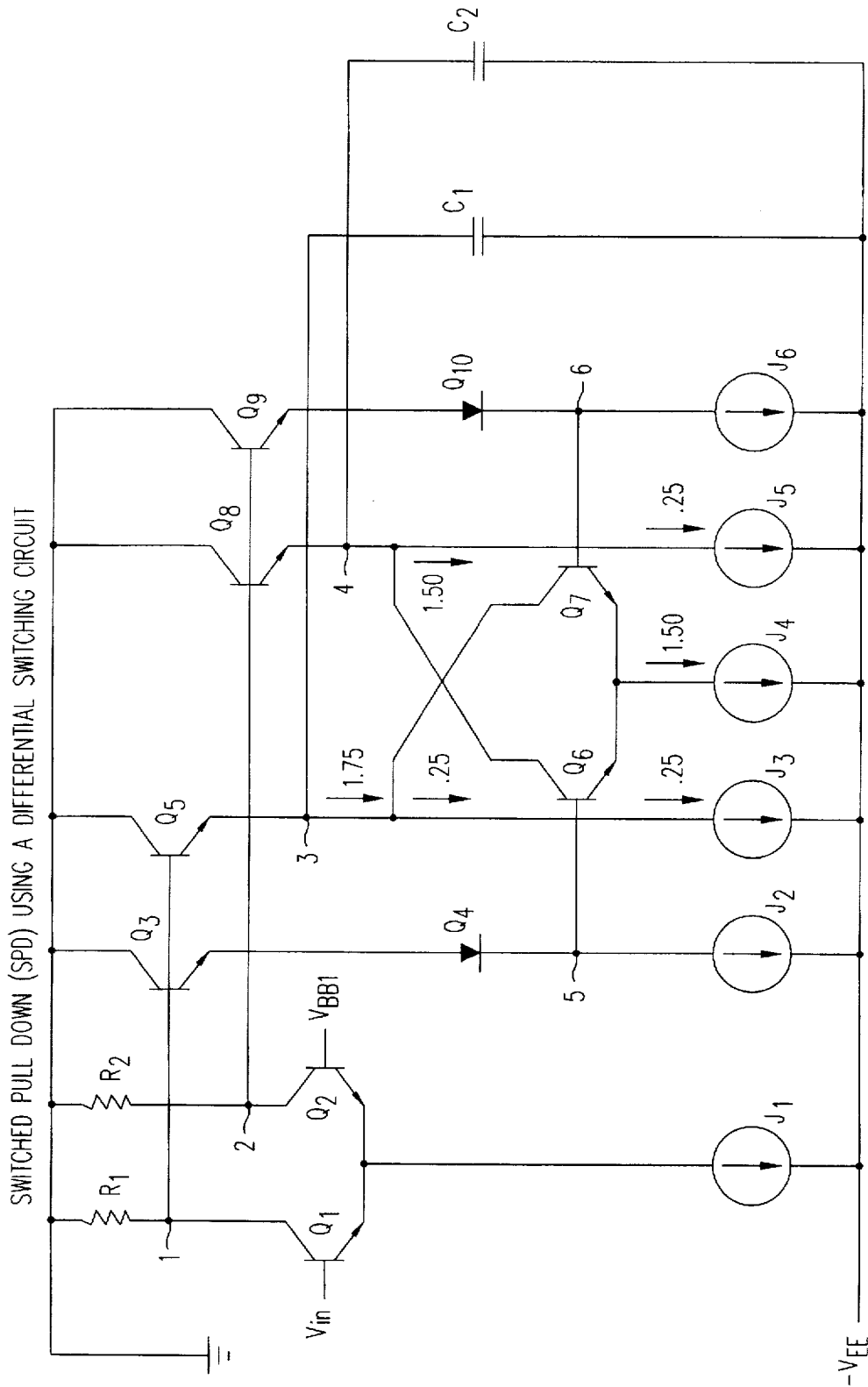
FIG. 5 illustrates one embodiment of the present invention in which a differential switching circuit implements a switched pull down ECL output stage.

FIG. 5 shows a practical circuit implementation of a switched pull down ECL output circuit according to the present invention. FIG. 5 illustrates the first embodiment of the present invention in which a switch pull down circuit uses a differential switching circuit to control the switched pull down current source.

The logic function implemented by the circuit of FIG. 5 is the same as the standard ECL circuit shown in FIG. 1, and consists of components current source J1, resistor R1, resistor R2, transistor Q1, and transistor Q2. However, the output stage of the circuit shown in FIG. 5 is modified over the standard ECL circuit of FIG. 1 in order to accommodate the Switched Pull Down (SPD) circuit concept by a first embodiment of the present invention.

The output stage consists of components transistors and diodes Q3–Q10, and current sources J2–J6. Pull up transistors Q5 and Q8 are emitter follower output transistors. Current switch transistors Q6 and Q7 are a switched pair of transistors. Switch control transistor Q3 and diode Q4, as well as switch control transistor Q9 and diode Q10, provide level shifting functions of dropping two forward biased diode voltages. Switch control current sources J2 and J6 provide current sinks for the level shifting circuits. Pull down current sources J3 and J5 alternatively provide pull down current for the positive going outputs, or else provide part of the pull down current for the negative going output. Pull down current source J4 provides current to the current switch. Capacitors C1 and C2 represent the load capacitances of the complementary outputs.

In this first embodiment, current sources J2 and J6 do not supply any pull down current to the output nodes, and as such, represent an increase in power without an increase in performance as measured. The currents in these current sources J2 and J6 should be only large enough to faithfully follow the collector voltage swings of transistors Q1 and Q2, but not so large as to be a significant part of the total circuit power dissipation.

Figure 6:
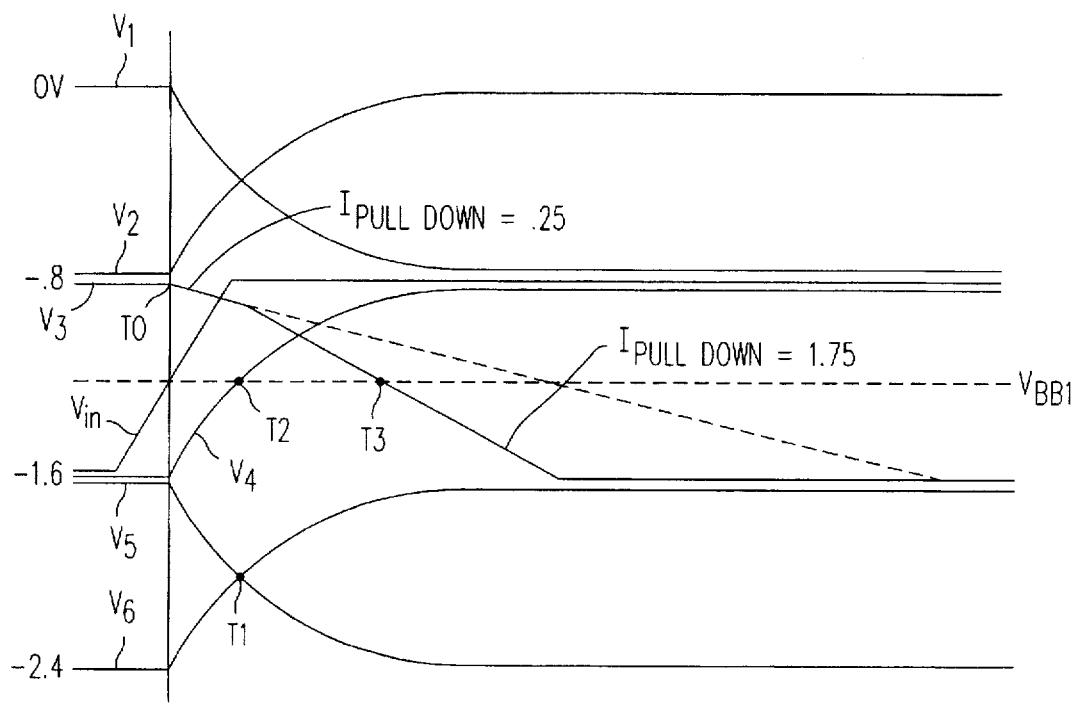
FIG. 6 is a voltage versus time plot of various node voltages of the circuit according to one embodiment of the present invention shown in FIG. 5.

FIG. 6 illustrates the operating waveforms for this switched pull down circuit according to the first embodiment of the present invention. When the input voltage Vin crosses the reference voltage VBB1, transistor Q1 is switched on, and transistor Q2 is switched off. The voltage waveforms resulting at the collectors of transistors Q1 and Q2 are shown as traces V1 and V2. The collector voltage level swings are level shifted and coupled to the bases of the switching transistors Q6 and Q7. The voltage waveforms at the bases of Q6 and Q7 are shown as traces V5 and V6 in FIG. 5. These base voltage waveforms follow the differential ECL collector voltage swings (at nodes 1 and 2) and are not influenced by the output voltage waveforms.

Transistors Q6 and Q7 switch when the polarity of the voltages at their bases reverse. This switching time is shown as T1. The collectors of Q6 and Q7 then direct the switched pull down current to the negative going output node, so that the pull down occurs at a faster rate beginning at time T1.

FIG. 5 shows the steady state pull down currents for the transition depicted in the waveforms of FIG. 6. The positive going output voltage appears at the emitter of output transistor Q8, which is an emitter follower that easily supplies the necessary pull up current to charge up load capacitor C2. The positive going output voltage is shown as trace V4. The rise delay time is shown as T2. The negative going output voltage is shown as waveform trace V3. It starts out with a small negative slope, and then changes abruptly to a large negative going slope. The change in slope occurs at the switching time T1. The shallow slope of trace V3 between time T0 and T1 occurs before the switching time because there is only 0.25 units of pull down current during this period. When switching occurs the pull down current is increased to 1.75 units of current. The steeper slope of trace V3 after T1 is due to the larger pull down current which occurs after switching.

The output capacitor C1 is discharged slowly during the period before switching prior to T1, and quickly during the period after switching at T1. The length of time until switching at T1 for the circuit in FIG. 5 is fixed, and is determined primarily by the RC time constant of the collector load resistors R1 and R2 and the collector node capacitance at nodes 1 and 2. The length of time until pull down is 50% complete at T3 is a variable delay that is output dependent, and is determined primarily by the size of the load capacitance and the amount of pull down current acting on the negative going output node. Usually, the load conditions are such that the time before the switching time at T1 is much shorter than the time from T1 to T3. Under these conditions, the time before switching time T1 is negligible, thus T1 is much less than T3. Traces V5 and V6 are decaying exponentials. If resistors R1 and R2 are the same, and if the capacitances C on nodes 1 and 2 are the same, the traces V5 and V6 have the same time constant RC. The traces V5 and V6 cross at time $t=RC \ln(2)$. The fall delay time is measured when the negative going output crosses the reference voltage VBB1 and is shown as T3. The fall delay time T3 for this switched pull down circuit according to the first embodiment of the present invention is approximately half of the fall delay time for the ECL circuit.

Figure 7:
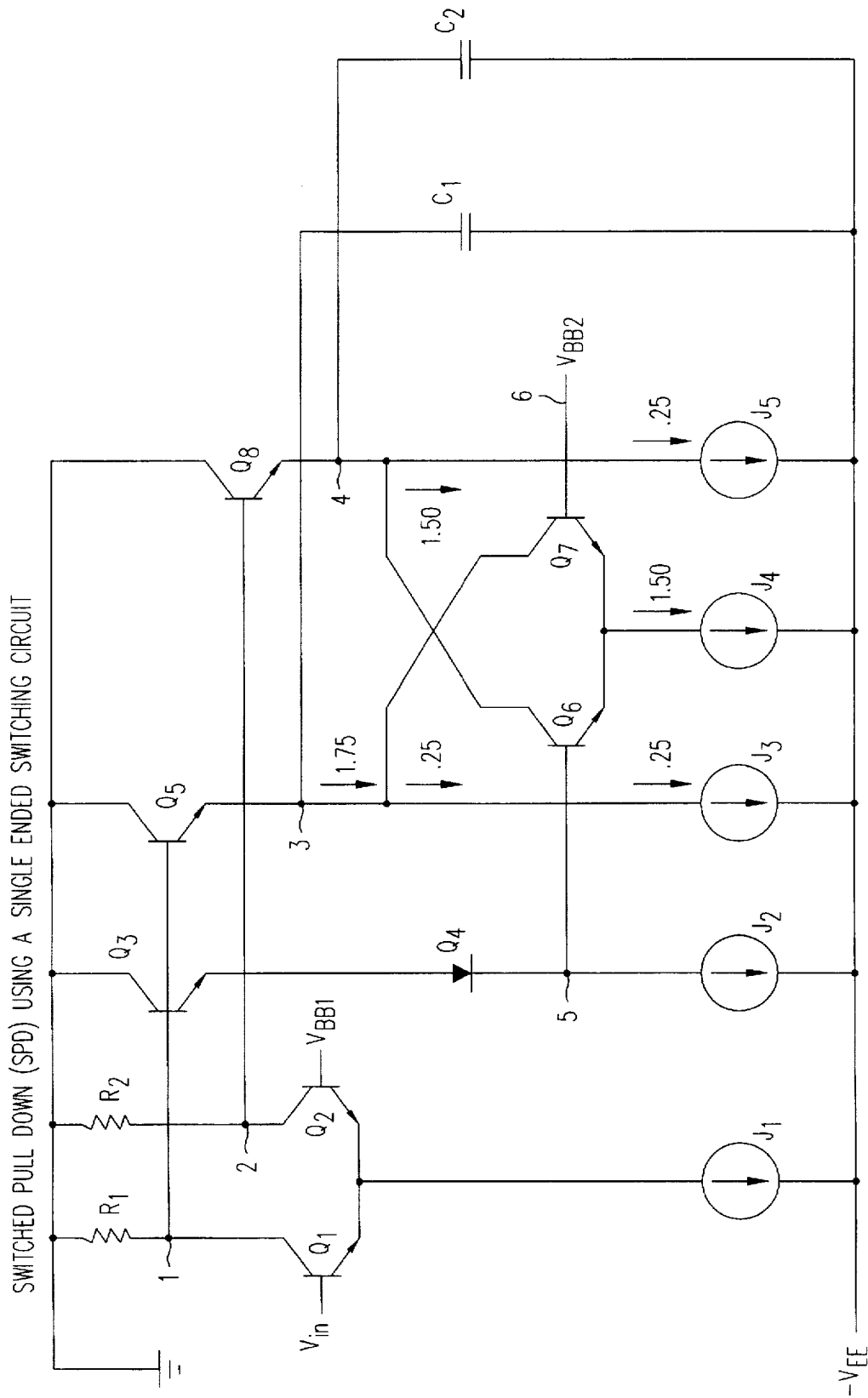
FIG. 7 illustrates a second embodiment of the present invention in which a single-ended switching circuit implements a switched pull down ECL output stage.
Figure 8:
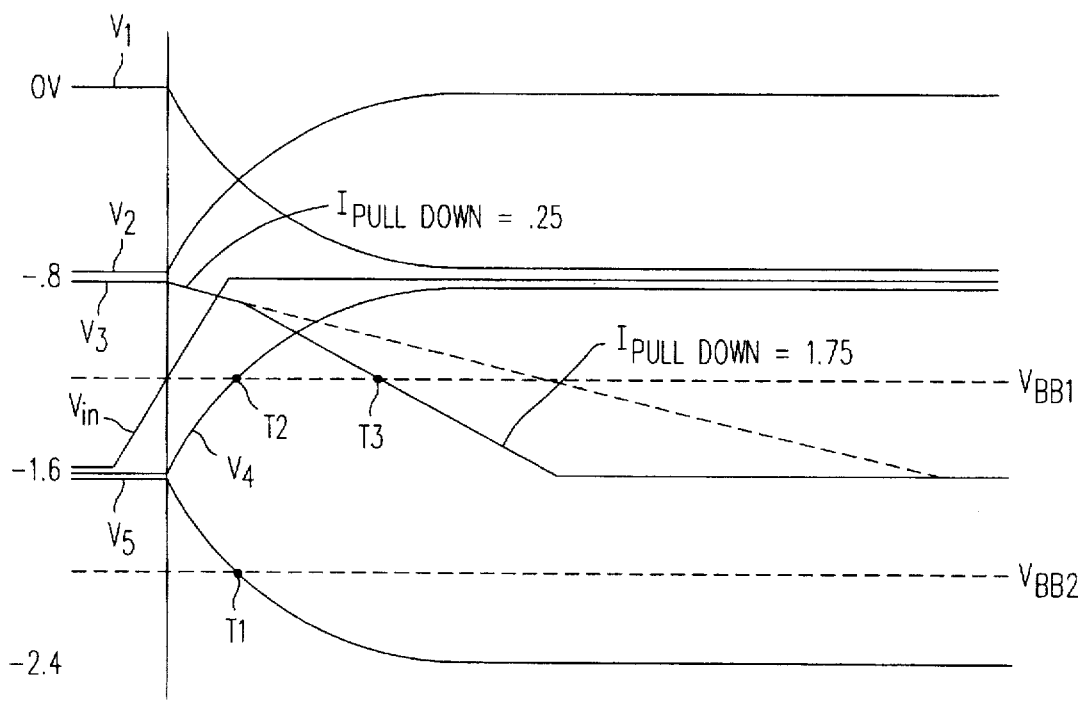
FIG. 8 is a voltage versus time plot of various node voltages of the circuit according to the second embodiment of the present invention shown in FIG. 7.

FIG. 7 shows a second embodiment of the present invention of a switched pull down ECL output stage using a single ended switching circuit. The previous switched pull down circuit in FIG. 5 according to the first embodiment had two differential input signals going to the switching circuit. The differential input signals require two level shifting networks. In contrast, the switched pull down circuit in FIG. 7 uses a single ended input switching circuit. Using a single ended switching circuit eliminates the need for one of the level shifting networks. This has the advantage of using less components and consuming less power. The circuit in FIG. 7 is the same circuit as the previous circuit in FIG. 5 except for one level shifter that has been eliminated. Transistor Q9, diode Q10, and current source J6 have been removed. The base of Q7 has been connected to a DC reference voltage VBB2. In the preferred embodiment, for ECL operation, the reference voltage VBB2 is midway between two and three forward biased diode drops below ground, which is illustrated as −2.0 Volts in FIG. 8. The input voltage of the switching stage swings from −1.6 volts to −2.4 volts. The reference voltage VBB2 is applied to the base of Q7. This voltage is set mid point to the input swing, and is equal to −2.0 volts. FIG. 8 shows the voltage waveforms for this switched pull down circuit according to a second embodiment of the present invention.

The voltage waveforms shown in FIG. 8 correspond to the circuit in FIG. 7 and are identical to the previous switched pull down circuit's waveforms with the exception of node V6. Node V6 is now connected to the reference voltage VBB2. Switching will occur when the single ended input signal V5 crosses the reference voltage VBB2. The switching time occurs at the same time $t=RC \ln(2)$ for both this circuit and the previous circuit. The switching time is shown as T1.

The output waveforms, and the output rise and fall delay times, are identical to those of the previous circuit having differential current switching. The output rise delay time is shown as T2. The output fall delay time is shown as T3. This switched pull down circuit using a single-ended switch according to the second embodiment has the same performance, but uses fewer components and consumes less power than the first embodiment using a differential switch.

Figure 9:
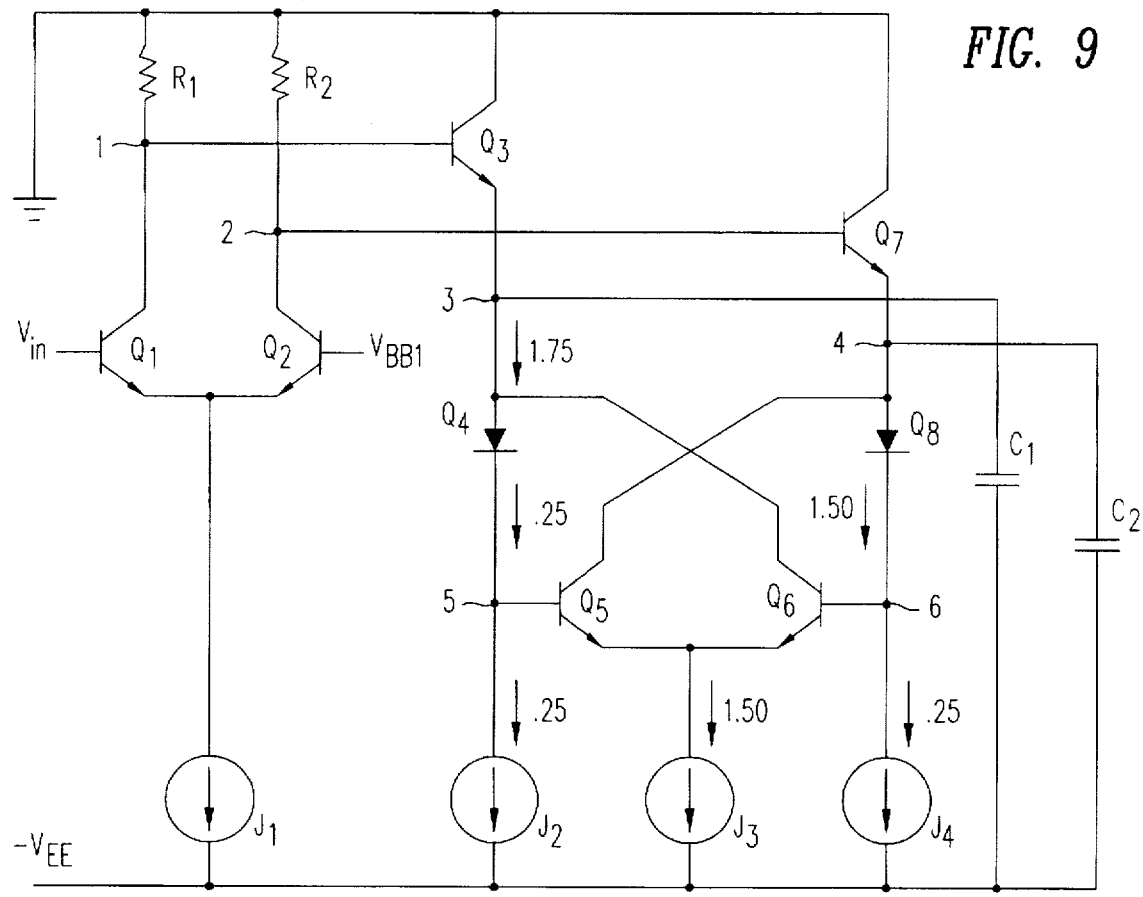
FIG. 9 illustrates a third embodiment of the present invention in which an output coupled switching circuit implements a switched pull down ECL output stage.
Figure 10:
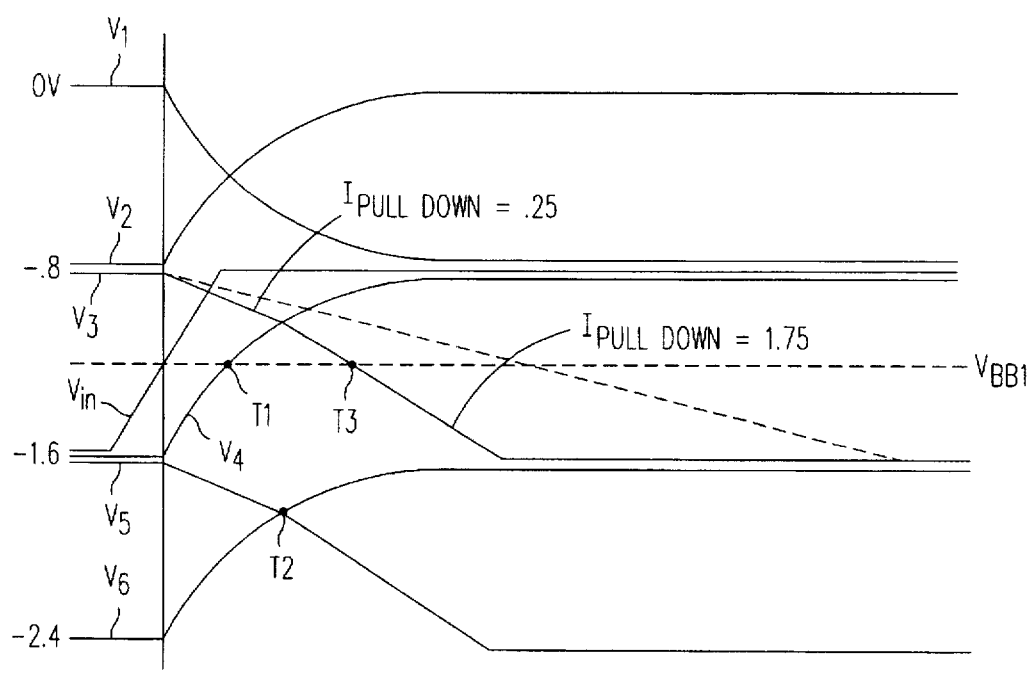
FIG. 10 is a voltage versus time plot of various node voltages of the circuit according to the third embodiment of the present invention shown in FIG. 9.

FIG. 9 shows a version of switched pull down using an output coupled switching circuit according to a third embodiment of the present invention. The switched pull down circuit in FIG. 5 required two current sources to power two level shifting circuits. In contrast, the switched pull down circuit in FIG. 7 required one current source to power one level shifting circuit. This switched pull down circuit (FIG. 9) requires no current sources to power the level shifting circuits. This circuit has the advantage of using fewer components and consuming less power than either of the previous two embodiments illustrated in FIGS. 5 and 7 circuits. This circuit eliminates both of the level shifting circuits that were used in the previous two switched pull down circuits. The switching transistors Q5 and Q6 are cross connected to the emitters of the output transistors Q3 and Q7. Transistors Q4 and Q8 serve as level shifting diodes to prevent saturation of the transistor pair Q5 and Q6. This third embodiment circuit functions similarly to the previous circuits. The logic function shown is similar to the original ECL circuit, and consists of components current source J1, resistor R1, resistor R2, transistor Q1, and transistor Q2. The output voltages from the collectors of transistor Q1 and transistor Q2, are level shifted through transistors Q3, Q4, Q7, and Q8, and coupled to the bases of switched transistor pair Q5 and Q6. Switching occurs when the polarity of the voltage at the bases of the switching transistors reverse. FIG. 10 shows the voltage waveforms for this switched pull down circuit according to the third embodiment of the present invention.

The input voltage waveform is shown by Vin. The DC reference voltage waveform is shown by VBB1. Traces V1 and V2 are the collector voltage waveforms of transistors Q1 and Q2 nodes 1 and 2. The level shifted input voltage waveforms to the switch are shown as V5 and V6. The output voltage waveforms are shown by V3 and V4. The rise delay time is shown as T1. The switching time is shown as T2. The fall delay time is shown as T3. The time before T2 switching time period is slightly longer in this circuit than in previous two embodiments.

In the circuit according to the first embodiment (FIG. 5), switching occurs when the voltage waveform V6 crosses the voltage waveform V5. For ECL operation, the switching voltage level of the positive going waveform V6 was approximately midway (50%) between two and three forward biased diode drops below the positive supply voltage (ground). However, in this circuit according to the third embodiment (FIG. 9), switching also occurs when the voltage waveform V6 crosses the voltage waveform V5, but the switching voltage level of V6 is higher than 50% as illustrated in FIG. 10 at time T2.

Moreover, the time before switching is greater with this third embodiment than in either of the previous two embodiments because the negative going waveform V5 is falling at a slower rate than in the previous circuits of FIGS. 5 and 7. Between the input switching time and time T2, the voltage at node 5 falls more slowly than in the previous circuits for the following reasons. The illustration of the waveforms in FIG. 10 assumes that the circuit previously had settled into the logically opposite output state prior to the input switching from low to high; therefore, the voltage of the inverting output node 3 is high. The base to emitter voltage of the pull up transistor Q3 is V1 minus V3. When the differential ECL node 1 goes low, transistor Q3 is cut off momentarily because its base to emitter voltage drops below a forward-biased diode voltage. While transistor Q3 is cut off, the inverting output node 3 connected to output capacitance C1 is drained solely by the pull down current of current source J2, which was specifically chosen to be a small value (0.25 units of current in the illustration of FIG. 10). Moreover, during the time prior to T2, the output pull down current switch is still in its previous state, therefore transistor Q6 has not begun to help pull down the inverting output node 3. Diode Q4 is forward biased throughout the circuit operation, and therefore the voltage V5 at base of the current switch transistor Q5 faithfully follows the inverting output node voltage V3 by one forward biased diode drop. Thus, before time T2, the voltage V5 falls at a relatively slow rate because only the small current from current source J2 is pulling down the output node 3.

Meanwhile, the voltage at the base of the other current switch transistor Q6 follows the rise of the differential ECL input node by two forward biased diode drops, which are incurred along the base-emitter junction of transistor Q7 and the diode Q8. The pull down current switch will not change states until V5 is less than V6. The rapidly positive going voltage waveform V6 must ascend to a higher voltage level before it can cross the slowly decreasing voltage waveform V5. The fall delay time T3 of this circuit of the third embodiment is slightly longer than in the previous circuits of FIGS. 5 and 7, but it is still much less than that of a standard ECL circuit. This switched pull down circuit using an output coupled switching circuit uses less power and fewer components than the previous embodiments. There are only four current sources according to this third embodiment: one current source to run the differential ECL logic amplifier, two pull down current sources, and one switched pull down current source. Because there are fewer current sources according to the third embodiment as compared to the first and second embodiments, the third embodiment uses less power.

As discussed heretofore, several prior art circuits may be relevant to the third embodiment of the present invention. The differences are discussed below.

FIG. 7 of U.S. Pat. No. 4,276,485 to P. Rydval (hereinafter "Rydval") appears to disclose an output stage which includes only one current source, rather than three as required by the third embodiment of the present invention. Rydval is similar to FIG. 9 showing the third embodiment of the present invention, but lacks the present invention's inclusion of the current sources J2 and J4 which bias the diodes and pull down transistors connected to the outputs nodes. These additional two current sources provide noise immunity and decrease the response time of the output-coupled pull down current switch and thereby increase the overall switching speed.

Without the additional current sources provided by the third embodiment of the present invention as shown by Rydval, the pull down switch transistor attached to the high-going output node requires more time to be turned off than according to the third embodiment of the present invention. This longer turn off time is a result of the fact that voltage on the base of the switch transistor being cut off does not follow the low-going output node to which it is coupled. Instead, the diode to which it is connected turns off, and the voltage on its base remains high until the charge on the switch transistor's base flows through its emitter to the negative supply, rather than being drained to the negative supply through a separate current source as in the third embodiment of the present invention. When the charge flows from the base through the emitter, it causes the switch transistor attached to the high-going output node to continue to draw a collector current equal to the transistor's gain (beta) times the current that flows into the base.

The fact that the pull down transistor attached to the high-going output node does not in fact cut off for quite some time impedes the rate of increase in voltage of the high-going output node because the pull up transistor attached to the high-going output node must fight the pull down switch transistor attached to the high-going output node which has not cut off yet. The fact that the rate of increase in the high-going output node is impeded also impedes the rate at which the pull down switch transistor connected to the low-going output node turns on, because the voltage on the base of the pull down switch transistor attached to the low-going output node follows the high-going output node through a coupling diode.

For all of the above reasons, it is believed the circuit of Rydval has inferior performance to the circuit of the third embodiment of the present invention illustrated in FIG. 9.

U.S. Pat. No. 4,754,171 to Dasai et al. (hereinafter "Dasai") in FIG. 4 appears to show an output coupled pull down switching circuit which is similar to the third embodiment of the present invention shown in FIG. 9. However, the circuit shown in Dasai FIG. 4 does not include any level shifting diodes; therefore, the pull down switch transistors will saturate and significantly increase the switching time delay. Furthermore, the circuit of Dasai FIG. 4 (similar to Rydval) does not include the two additional current sources which are required according to the present invention, and therefore the circuit of Dasai FIG. 4 lacks noise immunity and is slow in switching for the same reasons discussed with respect to Rydval above.

As discussed heretofore, U.S. Pat. No. 4,943,741 to Estrada et al. in FIG. 2 (hereinafter "Estrada") shows a circuit using blocking diodes D1 and D4 in conjunction with an alternative set of outputs at the collectors of transistors Q5 and Q6. These blocking diodes D1 and D4 will reduce the collector voltages of the pull down current switch transistors Q5 and Q6 by one forward biased diode voltage, resulting in a small enough collector-emitter voltage so that transistors Q5 and Q6 will saturate during the normal course of operation if standard ECL voltage swings are used.

However, according to the third embodiment of the present invention, the output nodes must be directly connected to the collectors of the pull down switch transistors, rather than through blocking diodes as in Estrada.

Figure 11:
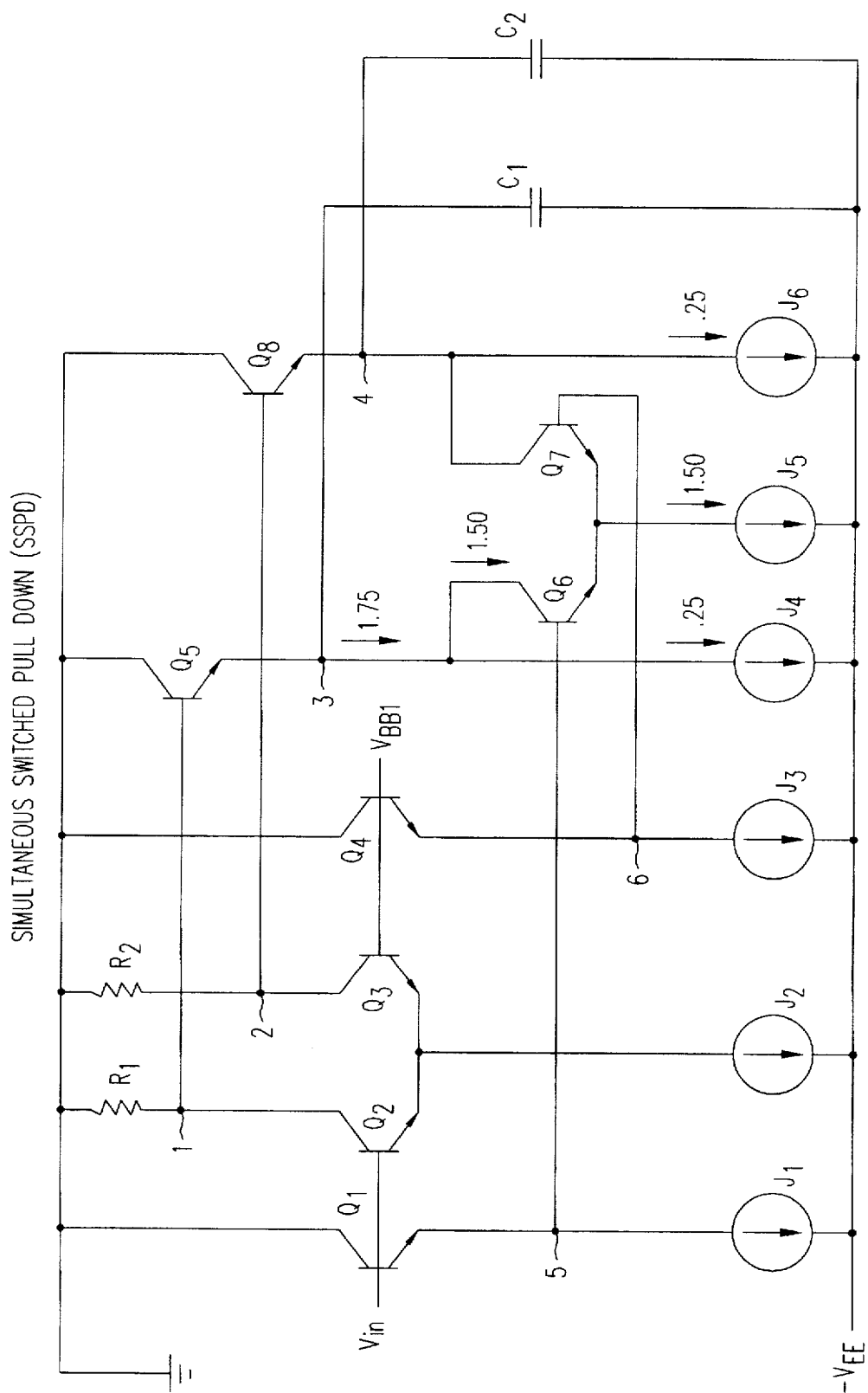
FIG. 11 illustrates a fourth embodiment of the present invention in which a pull down current control logic is performed simultaneously (in parallel and independently) with the pull up control logic in order to implement switched pull down ECL output stage.

FIG. 11 shows a Simultaneous Switched Pull Down (SSPD) circuit according to a fourth embodiment of the present invention. In the previous switched pull down circuit embodiments, when the load capacitance is very small, the time prior to switching time of the switched pull down current source can become a significant part of the total time required to discharge the output load capacitor. In this case, if maximum speed is to be achieved, it is desirable to reduce or eliminate the time period prior to switching the pull down current source. Causing the switched pull down current source to be switched as quickly as possible will speed the discharge of the output capacitor for the negative going output, and thus reduce the fall delay time of the circuit. The circuit of FIG. 11 eliminates the time prior to switching the pull down current source.

In the circuit of FIG. 11, the logic function shown (single input inverter) is the same as that shown for the original ECL circuit shown in FIG. 1, and consists of components current source J2, resistor R1, resistor R2, transistor Q2, and transistor Q3.

However, the output stage has been modified to accommodate the Simultaneous Switched Pull Down (SSPD) circuit concept. The output stage consists of components transistor Q1, transistors Q4, Q5–Q8, and current source J1, and current sources J3–J6. Transistors Q5 and Q8 are emitter follower output devices. Transistors Q6 and Q7 are a switched pair of devices. Transistor Q1 and transistor Q4 are emitter-followers which provide level shifting functions. Current sources J1 and J3 provide current sinks for these level shifting emitter follower circuits. The inputs to the logic circuit (bases of transistors Q2 and Q3) are logically in parallel with the inputs to the switching circuit (Q6 and Q7). The collectors of Q6 and Q7 are coupled to the appropriate output nodes. Capacitors C1 and C2 represent load capacitances.

There are three basic differences in this simultaneously switched pull down (SSPD) circuit according to the fourth embodiment and the previously described three embodiments of switched pull down circuits according to the present invention:

1. The logic circuit and switching circuit are logically equivalent to one another. The logical function of the logic circuit (transistor Q2 and transistor Q3) is identical to the logical function of the switching circuit (Q6 and Q7).
2. The switching circuit inputs are connected to the same logical inputs as the logic function inputs. The inputs to the switching circuit are no longer connected to the outputs of the logic circuit.
3. The logic circuits and switching circuits will switch simultaneously or at approximately the same time.

Where Vbb1 is a constant voltage, the embodiment shown in FIG. 11 becomes a single-ended input circuit. In that event, transistor Q4 and current source J3 are not needed and the base of transistor Q7 can be connected to a single ended threshold voltage, which lies midway between two and three forward biased voltage drops below ground.

Figure 12:
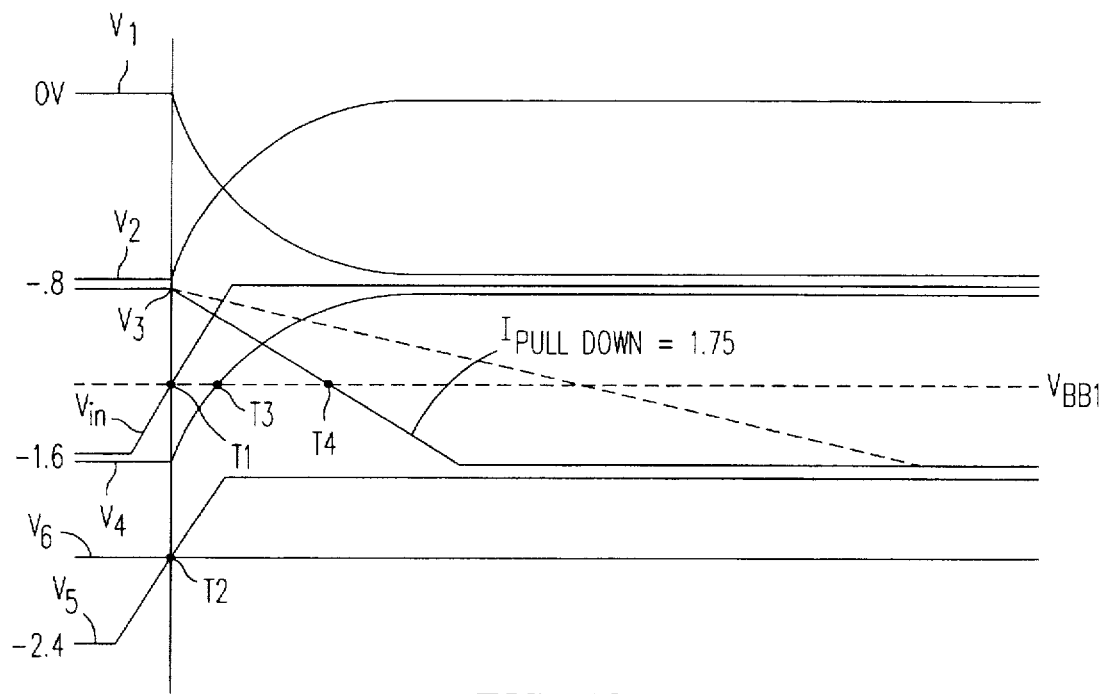
FIG. 12 is a voltage versus time plot of various node voltages of the circuit according to the fourth embodiment of the present invention shown in FIG. 11.

FIG. 12 shows the operating waveforms for this simultaneously switched pull down (SSPD) circuit according to the fourth embodiment of the present invention. The input waveform Vin crosses the reference voltage VBB1 at time T1. This causes the logic circuit transistor Q2 and transistor Q3 to switch states at time T1. The outputs of emitter followers transistors Q1 and Q4 provide a level shifted reproduction of the input signal, shown as traces V5 and V6, to the inputs of the switched pair of transistors Q6 and Q7. When Vin crosses VBB1, the level shifted waveforms V5 and V6 also cross, after the transit delay time of emitter follower transistors Q1 and Q4. This will cause the switching circuit transistors Q6 and Q7 to switch at time T2, which is at or just slightly after time T1. The total pull up propagation delay time to the output nodes is the transit time through the switched pair transistor Q2 and transistor Q3 plus the transit time through the emitter followers Q5 and Q8. The total pull down propagation delay time to the output nodes is equal to the transit time through the emitter followers transistor Q1 and transistor Q4 plus the transit time through the switched pair Q6 and Q7.

The pull up propagation delay time is equal to the pull down propagation delay time. The positive going output node is switched at the same time as the negative going output node. The simultaneously switched pull down (SSPD) output nodes are switched simultaneously. In simultaneously switched pull down (SSPD), there are two parallel signal paths. The first path is through the logic circuit to the output node. The second path is through the switching circuit, to the output node. The delays in each path are the same.

The simultaneously switched pull down (SSPD) switching circuit according to the fourth embodiment of the present invention is not connected to the outputs of the logic circuit, but rather to the inputs of the logic circuit. The logic circuit delay is eliminated from the path of the switching circuit controlling the pull down current. The time prior to switching the switched pull down current is eliminated because the logic circuit delay is not present in the pull down current switching control path.

The resulting output node voltages for the circuit of FIG. 11 according to the fourth embodiment are shown as waveforms V3 and V4 in FIG. 12. The output rise delay time is shown as T3. The output fall delay time is shown as T4. The dotted line shows a normal ECL negative going output waveform, and is shown here for comparison purposes only.

In simultaneously switched pull down (SSPD) according to the fourth embodiment of the present invention, the logic and switching circuits must be logically equivalent. For example, if the logic circuit is a two input nand circuit, then the switching circuit must also be a two input nand circuit. Because all of the embodiments of switched pull down circuits discussed so far have necessarily had complementary outputs, there is no real difference between a NAND circuit and an AND circuit or between a NOR circuit and an OR circuit. The only difference is in nomenclature assigned to the outputs; that is, the inverting output of a NOR gate is the non-inverting output of an OR gate. It is desirable, (but not strictly necessary) that the two circuits have the same topologies and delays. Slight differences in circuit delay and topology are tolerable if logical equivalence is preserved. Slight differences in path delays are also acceptable. Minor variations in the logical implementations of the pull up and simultaneous switched pull down circuits do not depart from the spirit and scope of the present invention.

Figure 13A:
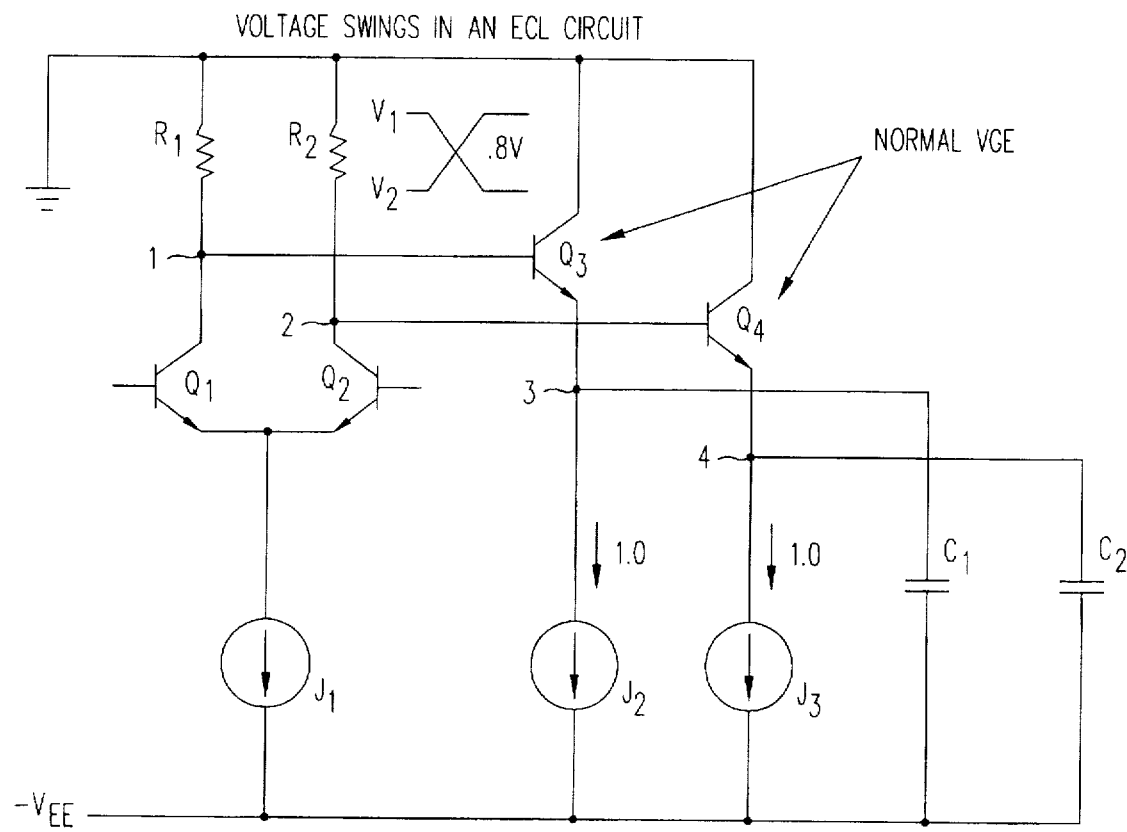
FIGS. 13(a–b) illustrate that the output differential voltage in a prior art differential ECL circuit is chosen to be approximately one forward biased diode voltage, which is approximately 0.8 Volts.
Figure 13B:
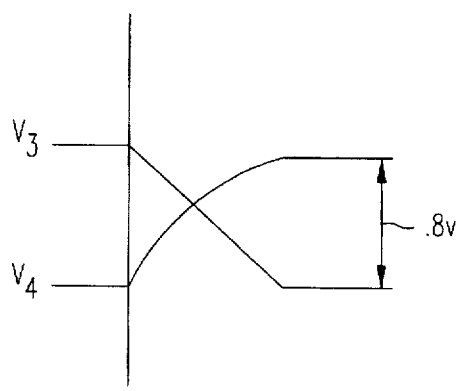

For example, if the inputs to the logic circuit (bases of transistor Q2 and transistor Q3) were to be removed from the bases of transistor Q1 and transistor Q4, and reconnected to the emitters of transistor Q1 and transistor Q4, the total propagation delay times to the two output nodes would differ only by the transit time through one emitter follower. The emitter follower transit time delay is small and may be considered negligible for most cases. The modified circuit is equivalent to simultaneous switched pull down. The propagation delay for switching of the pull down current is eliminated. The switching circuit could be converted to a single ended circuit to conserve the number of components and power. The simultaneously switched pull down (SSPD) circuit has a higher performance than the switched pull down (SPD) circuits and is particularly applicable for high speed applications FIG. 13 illustrates the typical voltage swings found in a standard ECL circuit. The component values in ECL circuits are carefully chosen to yield the correct voltage levels and swings. The voltage levels at the output are particularly important because these levels are defined standards for ECL technology. The collector voltage levels of transistor Q1 and transistor Q2 are 0.0 volts and −0.8 volts. The output node voltage levels are −0.8 volts and −1.6 volts. The transistor Q3 base to emitter voltage drop ($V_{be}$ drop) is equal to the transistor Q4 $V_{be}$ drop because both transistors are being sourced by an equal amount of pull down current. Both transistors have 1.0 unit of current.

The differential ECL collector voltage swings are shown as V1 and V2. The output voltage swings are shown as V3 and V4. Both the collector and output node swings are 0.8 volts.

Figure 14A:
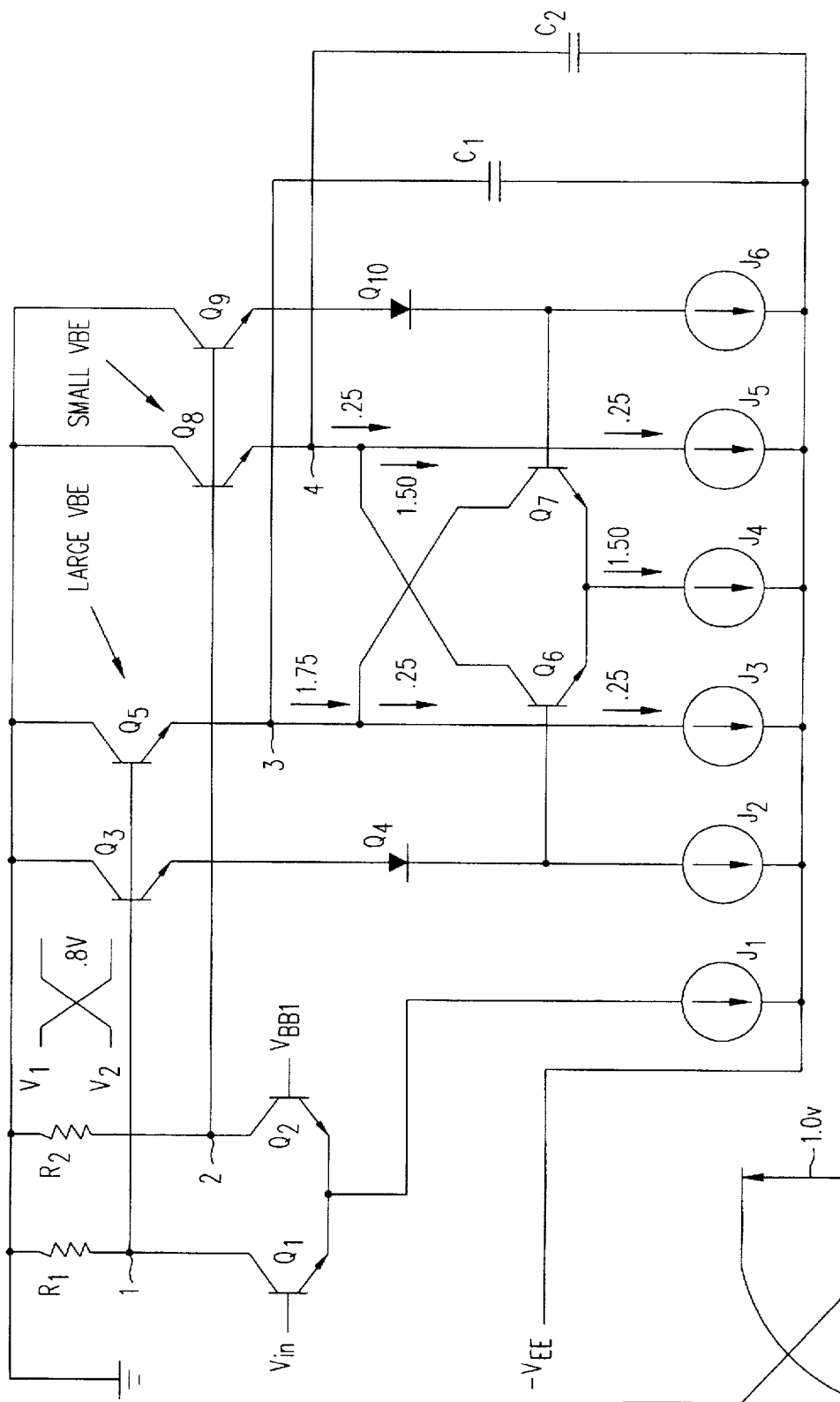
FIGS. 14(a–b) illustrate that an inequality in the pull down current sourced through the pull up transistors causes a larger output differential voltage to be produced according to the present invention.
Figure 14B:
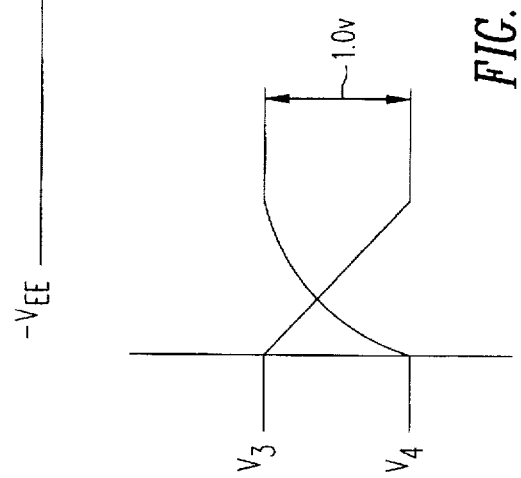

FIG. 14 shows the typical voltage swings found in a switched pull down circuit, using the first embodiment as an example. In this switched pull down circuit, the Q5 $V_{be}$ drop is larger than the Q8 $V_{be}$ drop, because the two transistors are being sourced by unequal amounts of pull down current. Transistor Q5 has a large pull down current (1.75 units), and transistor Q8 has a small pull down current (0.25 units). Transistor Q5 has a larger than normal $V_{be}$ and transistor Q8 has a smaller than normal $V_{be}$. This causes the negative going output node to swing more negative than normal, because of the increased $V_{be}$ of Q5. This also causes the positive going output node to swing more positive than normal, because of the reduced $V_{be}$ of Q8. The result of these large and small $V_{be}$ changes is, that the output node voltage swing is larger than normal. The output node voltage swing is approximately equal to 1.0 volt.

In FIG. 14, The collector voltage swings are shown as V1 and V2. The output voltage swings are shown as V3 and V4. V1 and V2 have a swing of 0.8 volt. V3 and V4 have a swing of 1.0 volt. The switched pull down output swing is 0.2 volts larger than the standard ECL voltage swing. The larger voltage swing causes the load capacitor to take a longer time to discharge, which causes a longer fall delay time to occur. Larger output voltage swings will occur in both switched pull down and simultaneously switched pull down (SSPD) circuits because of the unequal pull down currents occurring at the positive and negative going outputs.

Figure 15:
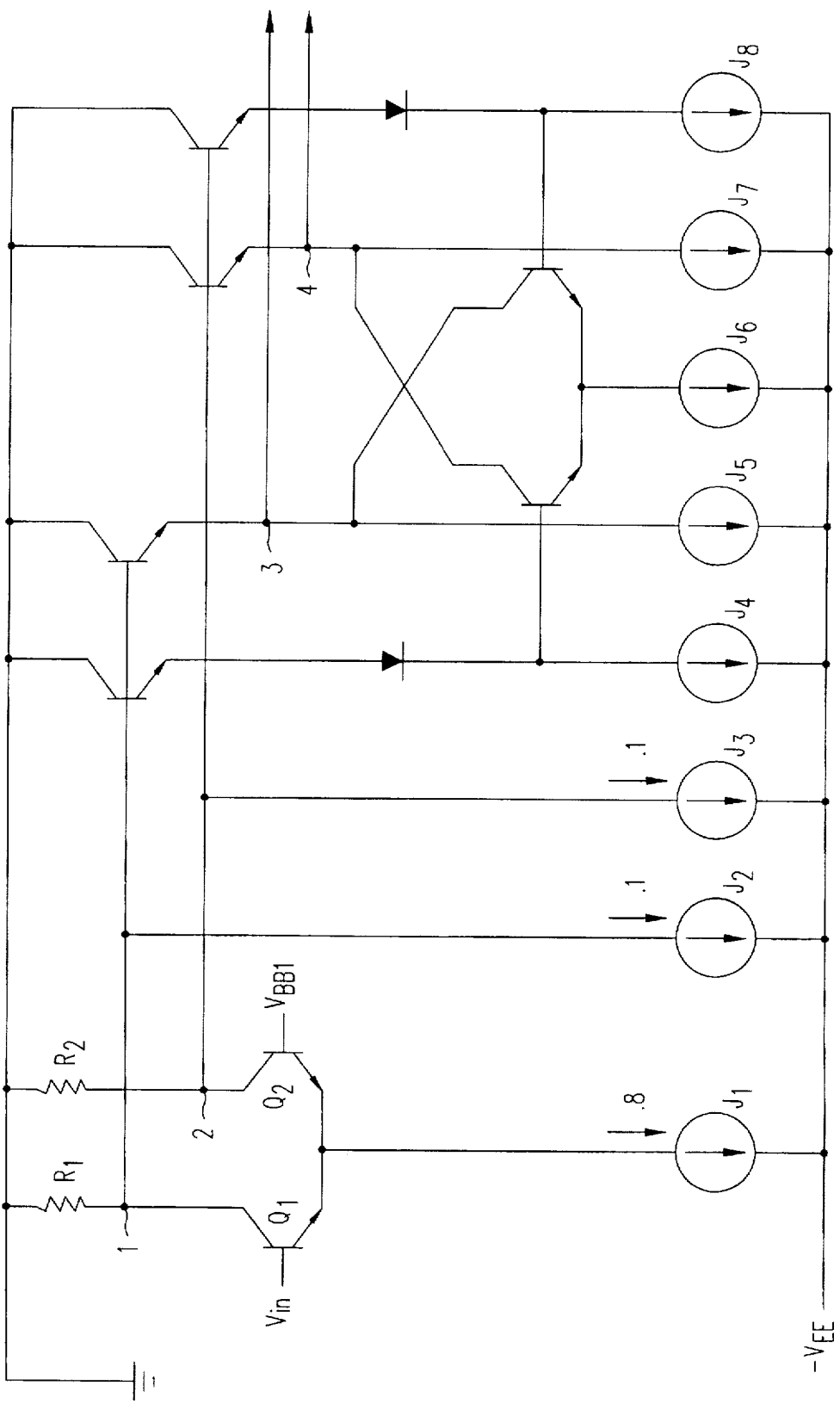
FIG. 15 illustrates a fifth embodiment of the present invention, in which current sources are used to reduce the voltage swings for internal nodes for a switched pull down circuit having a differential switching circuit to compensate for the larger output differential voltage generated according to switched pull down circuits of the present invention.

FIG. 15 shows a switched pull down circuit implementation, using current sources for level and swing adjustment according to a fifth embodiment of the present invention. This circuit modifies the logic circuit swing and offset voltages, present at the ECL logic circuit collectors, to correct the final switched pull down output voltage levels and swings, so they will be equal to standard ECL voltage levels. The original ECL logic circuit has been modified and consists of components current sources J1, J2, and J3, resistors R1 and R2, and transistors Q1 and Q2. Current sources J2 and J3 have been added to modify the output voltage levels according to the fifth embodiment of the present invention. The switched pull down output stage remains unchanged and is similar to the circuit previously described. Current source J1 is set at 0.8 units of current, and current sources J2 and J3 are set equal 0.1 units of current each. Resistors R1 and R2 are still set to their normal ECL resistance values. The collector voltage swing is reduced to 0.8 times normal because current source J1 is set at 0.8 times normal. An offset voltage of 0.1 times the normal swing is added to each collector because of the presence of current sources J2 and J3.

The result is a reduced voltage swing with slight offset voltage appearing at the collectors of the logic circuit (nodes 1 and 2 in FIG. 15). This collector voltage is the input voltage to the switched pull down output stage. The reduced voltage swing appearing at the input of the switched pull down stage will become enlarged and offset by the switched pull down stage due to the unequal $V_{be}$ drops discussed earlier.

The input voltage swing and offset may be set by the choice of current in the current sources J1, J2, and J3. The following equations apply to the voltage offset and swings of the circuit of FIG. 15, in which I1 is the current through current source J1, I2 is the current through J2, and I3 is the current through J3.

V offset=I2*R1, I3*R2

V swing=I1*R1, I1*R2

If the resistors and currents above are chosen so that the input to the switched pull down output stages have the proper level and swing, the switched pull down output voltages will correspond to normal ECL levels.

Figure 16:
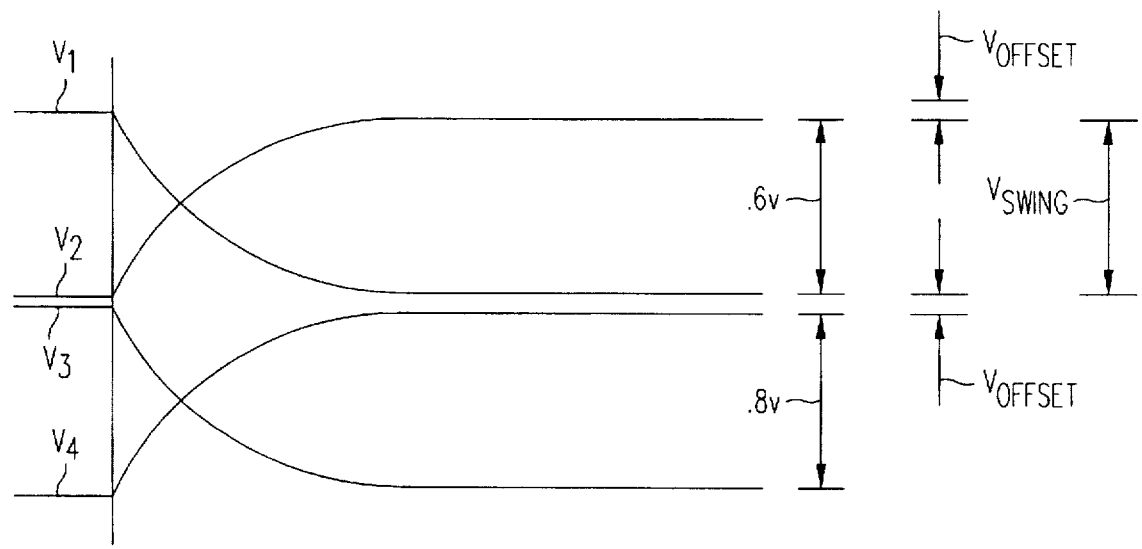
FIG. 16 is a voltage versus time plot of the internal nodes corresponding to the inputs of the switched pull down output stage having a differential switching circuit according to the present invention and of the outputs when current sources are used for level and swing adjustment according to the fifth embodiment of the present invention as shown in FIG. 15.

FIG. 16 illustrates the operating waveforms for the above switched pull down circuit using current sources as a level and swing adjustment circuit. The collector node voltage waveforms are shown as V1 and V2. The voltage swing of V1 and V2 is equal to 0.64 volts and the offset voltage is equal to 0.08 volts. These specific number are a consequence of the following facts. As discussed above, the differential ECL node absolute voltage difference is usually 0.8 Volts in a circuit such as illustrated in FIG. 13, and the supply current for the differential ECL input stage for the circuit of FIG. 15 according to the present invention is reduced to 80% of a standard value. Thus, as can be derived using the equations above and the standard absolute voltage differential, the absolute voltage differential between nodes 1 and 2 in the circuit of FIG. 15 is 0.8 V times 80%, which is 0.64 Volts. Thus, the absolute voltage swing is adjusted by selecting the current through current source J1 in FIG. 15.

The voltage offset, illustrated as "$V_{OFFSET}$" in FIG. 16 and noted as V offset in the above equation, are determined by choosing the amounts of current through sources J2 and J3. Since it is desirable for the voltage offset to be the same regardless of the polarity of the output, normally the currents through current sources J2 and J3 (I2 and I3, respectively) will be chosen to be equal. Because it is desirable for the offset above the trace of V2 and below the trace of V1 illustrated in FIG. 16 to be the same, the equal values of I2 and I3 must be carefully chosen so that the following equation holds.

Voffset=(0.8V−Vswing)/2

Conversely stated, Vswing plus two times Voffset must equal 0.8 Volts, as is the case discussed above in which Vswing is 0.64 Volts, and Voffset is 0.08 Volts.

Increasing current I2 shifts the entire trace of V1 down by an amount equal to R1 times I2. Increasing current I3 shifts the entire trace of V2 down by an amount equal to R2 times I3.

With properly chosen values for current sources J1, J2, and J3, The switched pull down output voltage waveforms are shown as traces V3 and V4 in FIG. 15. The output voltage swing is approximately 0.8 volts. The switched pull down output voltage levels are corrected to be equal to normal ECL output voltage levels. The level and swing adjustment techniques illustrated in FIG. 15 are also applicable to simultaneously switched pull down (SSPD) circuits.

Figure 17:
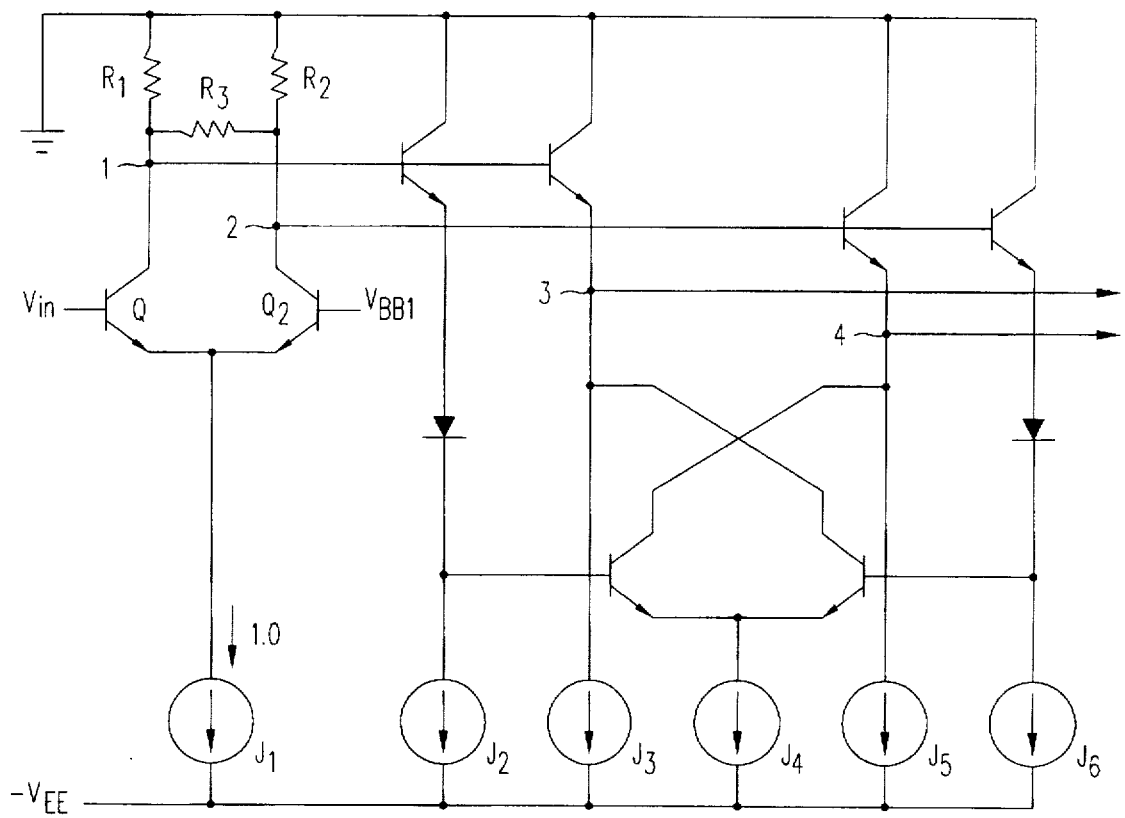
FIG. 17 illustrates a sixth embodiment of the present invention in which a first resistor network is used to reduce the voltage swings for internal nodes for a switched pull down circuit having a differential switching circuit to compensate for the larger output differential voltage generated according to switched pull down circuits of the present invention.

FIG. 17 shows a switched pull down circuit implementation using a first resistor network for level and swing adjustment according to a sixth embodiment of the present invention. This circuit also modifies the logic circuit collector voltage levels V1 and V2, to correct the switched pull down output voltage levels, so they are equal to standard ECL levels. The standard ECL logic stage has been modified and consists of components current source J1, transistor Q1, transistor Q2 and resistors R1–R3; resistor R3 has been added to modify the output voltage levels. The switched pull down output stage remains unchanged and is similar to any of the circuits previously described in the first, second, third, or fourth embodiments.

In the circuit shown in FIG. 17, the current source J1 is set at 1.0 units of current. The collector currents of Q1 and Q2 divide through the resistor network resistor R1–R3. The values of resistor R1–R3 are chosen, so as to produce similar voltages at the collectors of transistor Q1 and transistor Q2, as were produced in the circuit of FIG. 15 using current sources for voltage and swing adjustment.

$$V \text{ offset} = \{I1[(R1+R3)\|R2]\} * \{R1/(R1+R3)\}$$

$$V \text{ swing} = \{I1[(R1+R3)\|R2]\} - \{V \text{ offset}\}$$

The result is a reduced voltage swing with a slight offset voltage appearing at the collectors of the logic circuit at nodes 1 and 2. This voltage is applied to the input of the switched pull down output circuit. The resulting switched pull down output voltages are standard ECL voltage levels.

Figure 18:
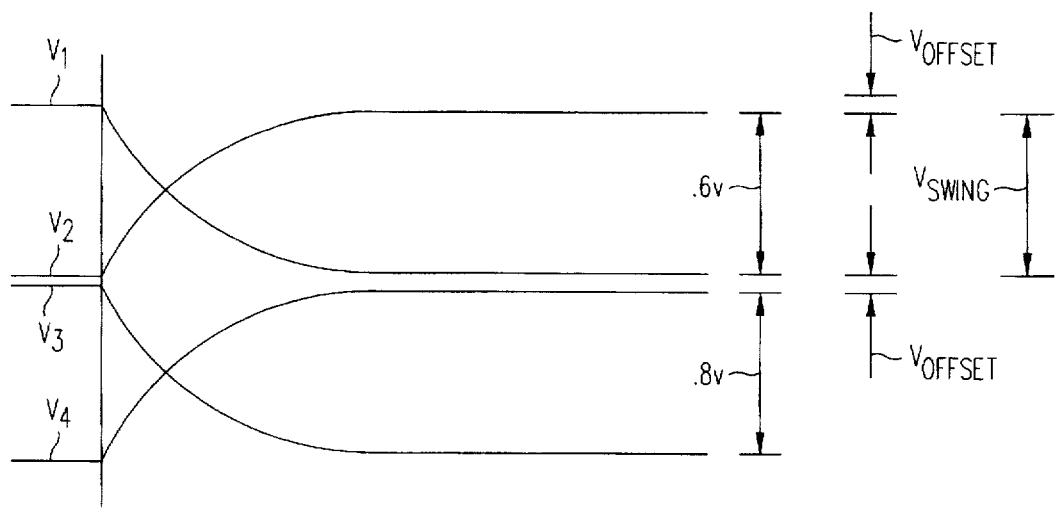
FIG. 18, similarly to FIG. 16, is a voltage versus time plot of the internal nodes corresponding to the inputs of the switched pull down output stage having a differential switching circuit according to the present invention and of the outputs when a first resistor network is used for level and swing adjustment according to sixth embodiment of the present invention shown in FIG. 17.

FIG. 18 shows the operating waveforms for the above switched pull down circuit using resistor network #1 for level and swing adjustment according to the sixth embodiment of the present invention. The collector node voltage waveforms are shown as V1 and V2. The collector swing and offset voltages are similar to those in the previous circuit. The switched pull down output voltage waveforms are shown as V3 and V4. The output voltage levels are similar to those in the previous circuit. The switched pull down output voltage levels are corrected to be equal to normal ECL output voltage levels.

This first resistor network is also applicable to reduce voltage swings and correct offsets for pull down circuits according to any of the first four embodiments, including single-ended or differentially simultaneously switched pull down (SSPD) circuits of the fourth embodiment.

Figure 19:
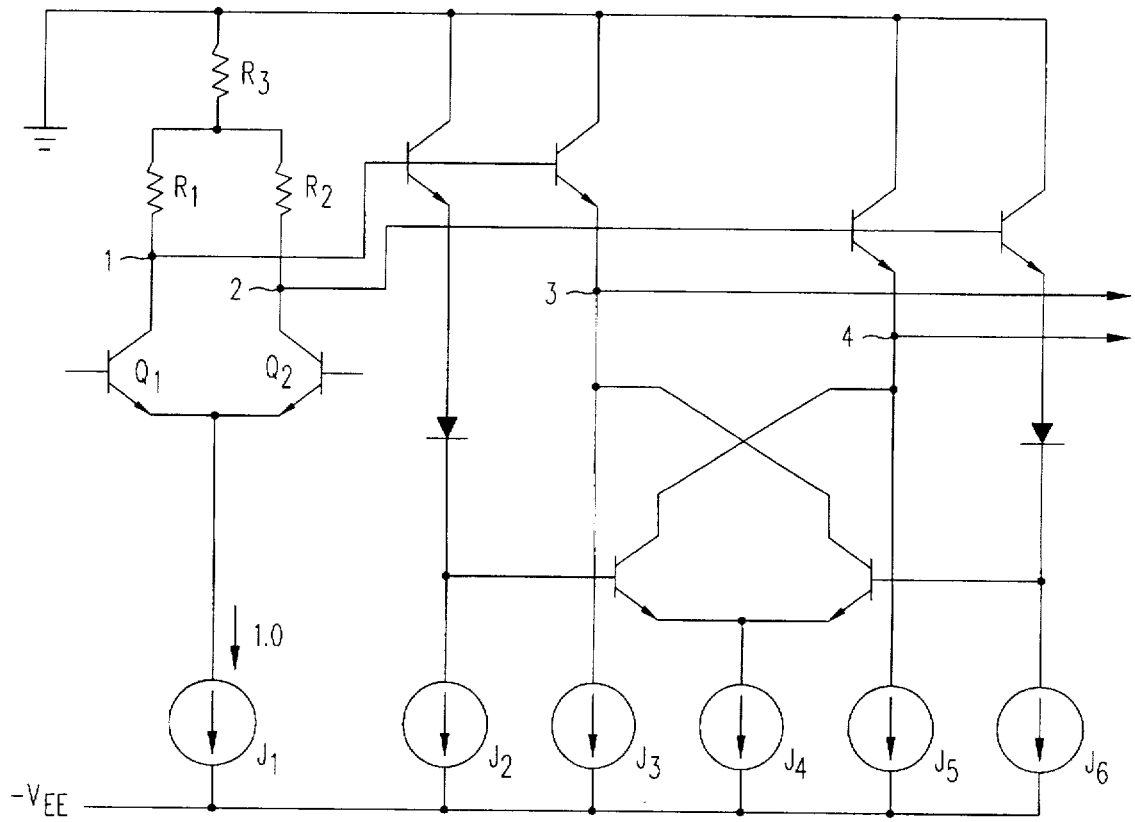
FIG. 19 illustrates a seventh embodiment of the present invention in which a second resistor network is used to reduce the voltage swings for internal nodes for a switched pull down circuit having a differential switching circuit to compensate for the larger output differential voltage generated according to switched pull down circuits of the present invention.

FIG. 19 shows an alternative switched pull down circuit implementation using a second resistor network for level and swing adjustment, and represents a seventh embodiment of the present invention. This circuit also modifies the logic circuit collector voltage levels, to correct the switched pull down output voltage levels, so they are equal to standard ECL levels. The original ECL logic circuit has been modified and consists of components current source J1, transistor Q1, transistor Q2 and resistor R1–R3. Similar to the sixth embodiment, resistor R3 has been added to modify the output voltage levels; however, the resistor network formed by resistors R1–R3 is different in this embodiment than the resistor network formed in the previously described sixth embodiment. The switched pull down output stage used with this second resistor network can be any of the first four embodiments (shown as differential input circuits or described previously as single input circuits).

In this circuit, the current source J1 is set at 1.0 units of current. The collector currents divide through the resistor network resistor R1–R3. The values of resistors R1–R3 are chosen, so as to produce similar voltages at the collectors of transistor Q1 and transistor Q2, as were produced in the previous circuit. The following equations are the equations involved in the design choice.

$$V \text{ offset} = I1 * R3$$

$$V \text{ swing} = I1 * R1, I1 * R2$$

The result is a reduced voltage swing with a small offset voltage appearing at the collectors of the logic circuit. This voltage is applied to the input of the switched pull down output circuit. The resulting switched pull down output voltages are corrected to be ECL voltage levels.

Figure 20:
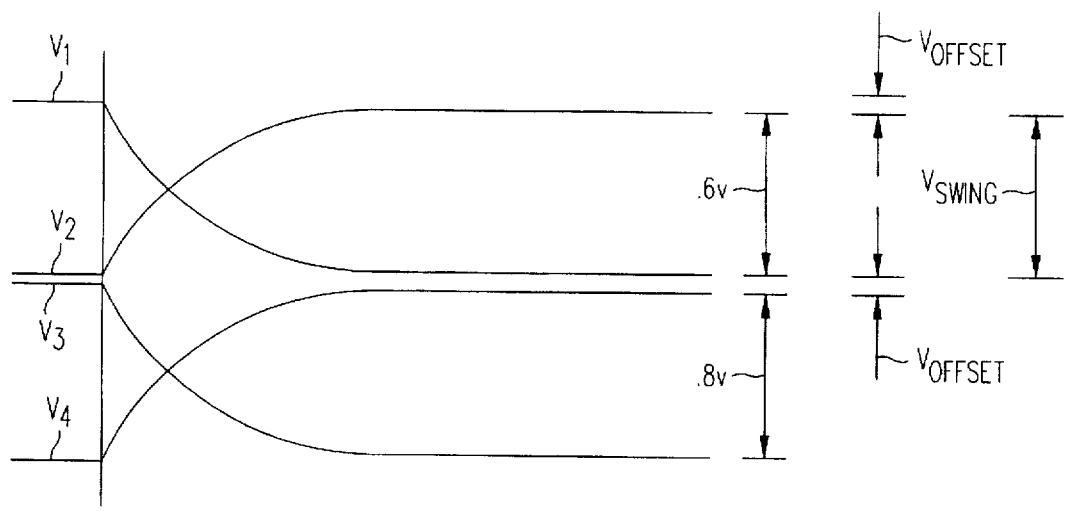
FIG. 20, similarly to FIGS. 16 and 18, is a voltage versus time plot of the internal nodes corresponding to the inputs of the switched pull down output stage having a differential switching circuit according to the present invention and of the outputs when a second resistor network is used for level and swing adjustment according to seventh embodiment of the present invention shown in FIG. 19.

FIG. 20 shows the operating waveforms for the above switched pull down circuit using resistor network #2 for level and swing adjustment. The collector node voltage waveforms are shown as V1 and V2. The collector swing and offset voltages are similar to those in the previous two embodiments. The switched pull down output voltage waveforms are shown as V3 and V4. The output voltage levels are similar to those in the previous circuit. The switched pull down output voltage levels are corrected to be equal to normal ECL output voltage levels. This technique is also applicable to simultaneously switched pull down (SSPD) circuits and any of the switched pull down output stages according to any of the first four embodiments (shown as differential input circuits or described previously as single input circuits).

In practice, many circuit configurations may be used to accomplish the logic voltage level preconditioning described in these last three embodiments (fifth, sixth, and seventh). These many additional configurations will be obvious to those skilled in the art, and are deemed not to depart from the spirit and scope of the present invention.

Figure 21:
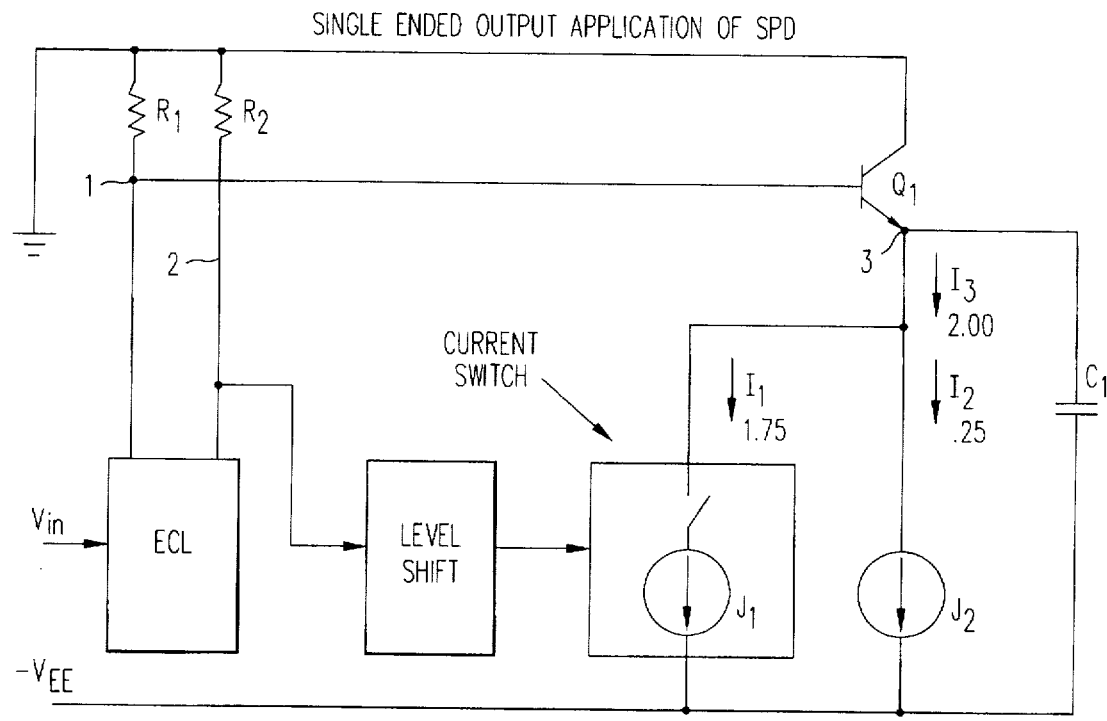
FIG. 21 illustrates an eighth embodiment of the present invention in which a single ended ECL output is generated using a switched pull down circuit.

FIG. 21 shows a single ended output application of switched pull down according to an eighth embodiment of the present invention. A block diagram is used here, and in the following sections, to demonstrate the concepts of single ended switched pull down. The block diagram functions are similar to the functions described in earlier sections. The circuits could be easily implemented with circuits described in the earlier sections or with variations of those circuits.

The intent here is to show the application of switched pull down to single ended circuits, and not to get bogged down with circuit details that are obvious from teachings in the previous sections.

In FIG. 21, the output of the differential ECL logic stage 2101 is coupled to the input of a level shifter circuit. The level shifter, which can be a diode, converts the signal levels from the ECL circuit, to the levels that are required by the current switch. The output of the level shift circuit goes to the input of the current switch. The current switch is arranged to turn on the current source current source J1 when the output voltage is negative going, and turn off the current source when the output voltage is positive going. This causes a large pull down current to flow when the output goes negative, and a small pull down current to flow when the output goes positive. Transistor Q1 is an emitter follower output transistor. Capacitor C1 represents the single-ended output load capacitance.

Figure 22A:
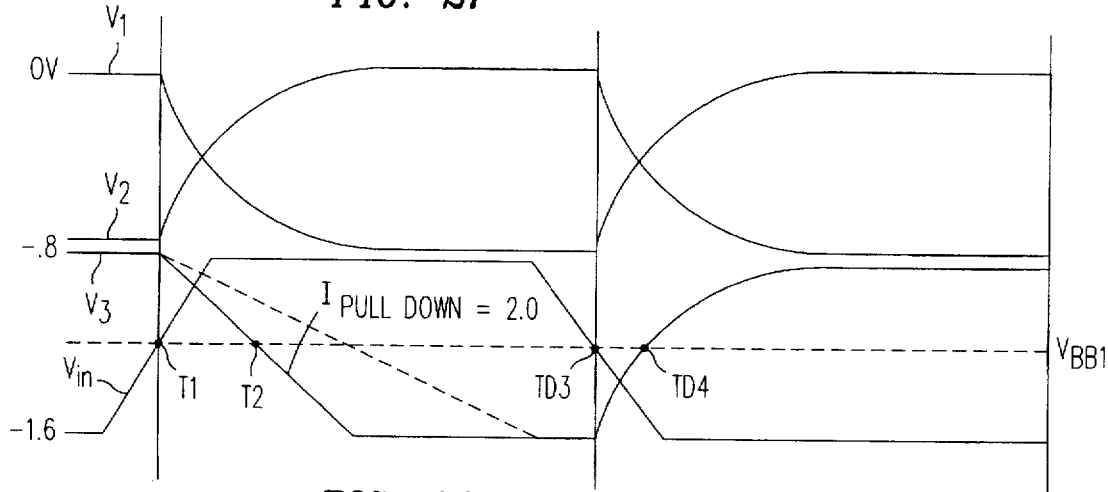
FIG. 22A is a voltage versus time plot of the input, output, and two differential internal nodes for a typical low to high and then high to low input transition.

FIG. 22A shows the resulting waveforms for this single-ended switched pull down circuit which undergoes positive and negative transitions at the input. Trace Vin shows the input voltage waveform. V1 and V2 show the voltage waveforms at the output of the ECL logic circuit. V3 shows the switched pull down output voltage waveform. VBB1 is a DC reference voltage and represents the switching threshold voltage for the ECL logic circuit. A dotted line shows the standard ECL output voltage waveform that would result with only one unit of pull down current. It is shown here for reference only.

Figure 22B:
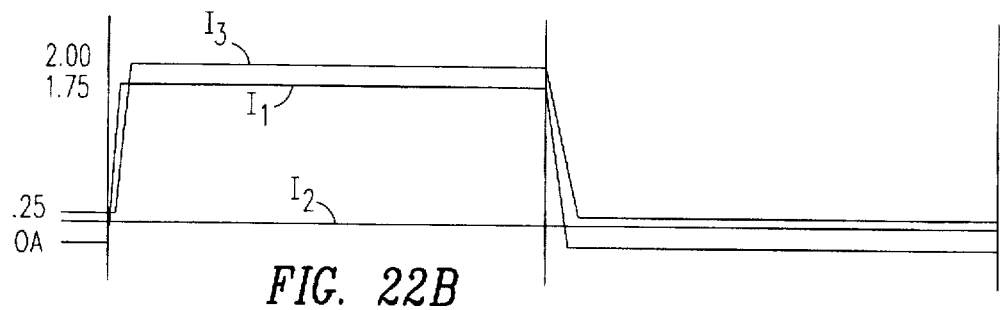
FIG. 22B is a current versus time plot of the total pull down current, pull up bias current source, and switched pull down current source during the transitions illustrated in FIG. 22A.

FIG. 22B shows the current waveforms I1, I2, and I3 during the transition of FIG. 22A for the circuit of FIG. 21. In FIG. 22B, I1 is a switched current which has a value of 1.75 units of current when on, and zero when off. I2 is a DC current of 0.25 units of current. The value of I3 is the sum of I1 and I2. I3 has a value of 2.0 units of current when the output is negative going, and 0.25 units of current when the output is positive going. In FIG. 22A, the ECL switching time for Vin going positive is shown as T1. The switched pull down output fall delay time is shown as T2. The ECL logic switching time for Vin going negative is shown as T3. The switched pull down output rise delay time is the time from T3 to T4.

The switched pull down output fall delay time is approximately half of what it would be for a standard ECL circuit because the pull down current for the switched pull down circuit is approximately twice as strong as that of the ECL circuit. The power dissipated in this circuit is proportional to the integral of current over time. The total power dissipated is directly related to the output duty cycle. Power dissipation is minimized when the pull down period of time is minimized. The Speed*Power product of this circuit is approximately two times better than that of conventional ECL circuits, assuming a 50% duty cycle.

Figure 23:
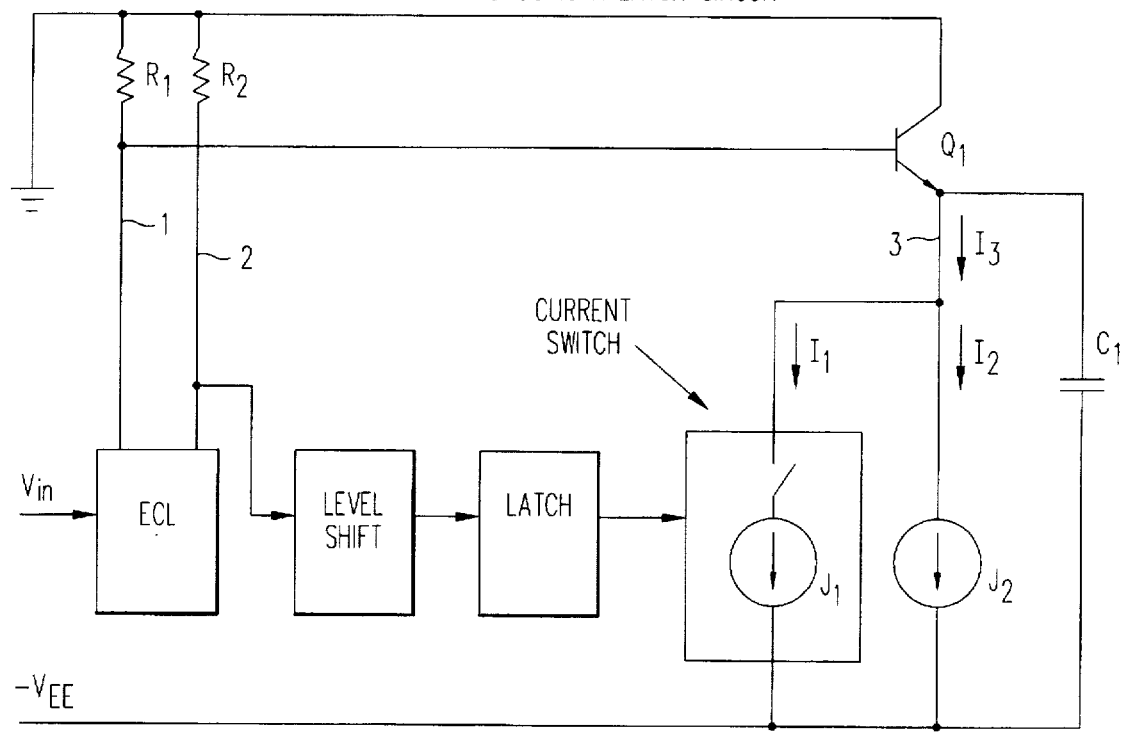
FIG. 23 illustrates a ninth embodiment of the present invention in which a single ended ECL output is generated using a switched pull down circuit using a latch to control the switched pull down current source.

FIG. 23 shows a single ended switched pull down circuit using a latch circuit according to a ninth embodiment of the present invention. The level shift circuit shown may be a direct coupled or capacitor coupled circuit. Capacitor coupling is often desirable to accommodate operation with a large range of power supply voltage, or to reduce the quiescent currents associated with direct coupled circuits. Positive and negative signal transitions may be passed through the level shifting capacitors to the latch, and stored as states in the latch. For example, a positive transition may be used to set the latch and a negative transition may be used to reset the latch. The latch could have zero or non-zero input hysteresis without departing from the spirit and scope of the present invention.

The outputs of the latch are DC voltage levels. These DC voltage levels are level shifted representations of the logic levels at the output of the ECL logic circuit. DC logic level transitions are passed through coupling capacitors to the inputs of a latch and then converted back to DC voltage levels at the output of the latch. Many low power latch designs are possible, particularly with the BICMOS technology. This circuit shown as the ninth embodiment of the present invention allows operation over a large range of power supply voltages.

The Speed*Power advantages of this single ended switched pull down circuit are similar to those of the circuit of FIG. 21 according to the eighth embodiment.

Figure 24:
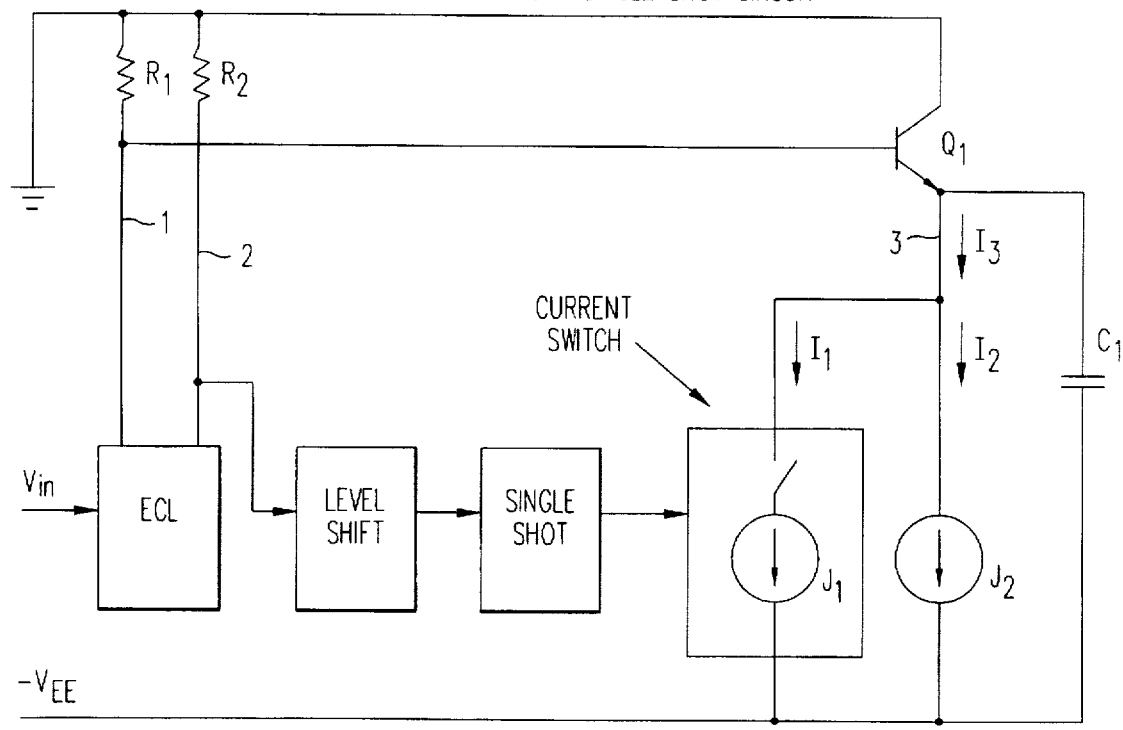
FIG. 24 illustrates a tenth embodiment of the present invention in which a single ended ECL output is generated using a switched pull down circuit using a single shot (one shot) to control the switched pull down current source.

FIG. 24 shows a single ended switched pull down circuit using a single shot circuit as a tenth embodiment of the present invention. The purpose of the single shot in this circuit is to turn on the current source J1 momentarily, during the period that the switched pull down output is swinging in the negative direction. The pull down current is increased only for that period necessary to pull the output voltage down, and then is decreased to a smaller standby current after the output voltage level is down. This gives a large pull down current during the negative transition period, when it is needed for performance, and then reduces the pull down current for the remainder of the period, when a large pull down current is not needed. This saves power by turning off the large pull down current when it is not actually needed. The Speed*Power product according to the tenth embodiment is improved by minimizing the period of time that current source J1 is turned on. To achieve the minimum speed-power product, the duration of the one-shot should be dependent upon the output load capacitance C1; the higher the load capacitance, the longer the duration of the one shot output pulse for a given pull down current. The level shifter in this embodiment can be a diode or a capacitor.

This invention is not intended to be limited to the circuit implementations shown here. Many other variations and circuit implementations for switched pull down circuits exist. These variations and implementations will be obvious to others who are skilled in the art.

The invention lies in the concepts of switched pull down, simultaneous switched pull down, level pre-conditioning, and single ended switched pull down. The switched pull down techniques according to the present invention apply to most ECL (using 0.7 mv swing) and CML (Common Mode Logic) (using 200 mv, 300 mv or any other amount of voltage swing) circuit families. The invention is also applicable to most technologies, including but not limited to Bipolar, MOS, CMOS, and BICMOS. The invention also applies to single-ended, complementary, and differential logic, to a wide range of power supply voltages, to high and low voltage operation, and to zero, light, and heavy loads.

While the present invention has been disclosed with particular reference to ten illustrative embodiments, those embodiments are presented by way of example, not by way of limitation. Those of ordinary skill in the art would be enabled by this disclosure to add to or modify those embodiments of the present invention in various ways as needed and still be within the scope and spirit of the present invention as recited in the appended claims. Accordingly, various changes and modifications which are obvious to a person skilled in the art to which the invention pertains are deemed to lie within the spirit and scope of the invention as claimed.

What is claimed is:

1. An emitter-coupled logic (ECL) output stage comprising:

a current source having a current source intake and a current source output;

a first pull down current source having a first pull down current source intake and a first pull down current source output;

second pull down current source having a second pull down current source intake and a second pull down current source output;

first pullup transistor having a first pullup collector, a first pullup base, and a first pullup emitter;

a second pullup transistor having a second pullup collector, a second pullup base, and a second pullup emitter; and a current switch having first and second current switch inputs and a current switch output; said current switch further comprising:

a first current switch transistor having a first current switch base, a first current switch collector, and a first current switch emitter; and a second current switch transistor having a second current switch base, a second current switch collector, and a second current switch emitter;

wherein the first current switch emitter and the second current switch emitter are connected to the current switch output;

a first switch control transistor having a first switch control collector, a first switch control base, and a first switch control emitter;

a first level shifting diode having a first level shifting diode input and a first level shifting diode output; and a first switch control current source having a first switch control current source intake and a first switch control current source output;

wherein the first switch control base is connected to the first pullup base, the first switch control emitter is connected to the first level shifting diode input, and the first level shifting diode output is connected to the first current switch base and the first switch control current source intake;

wherein the first pull down current source intake is connected to the first current switch input and the first pullup emitter;

wherein the second pull down current source intake is connected to the second current switch input and the second pullup emitter;

wherein the current switch output is connected to the current source intake;

wherein, when a first voltage applied to the first pullup base is less than a second voltage applied to the second pullup base, the current switch assumes a first state in which a current at the current switch output is essentially equal to the current at the first current switch input; and wherein, when the first voltage applied to the first pullup base is greater than the second voltage applied to the second pullup base, the current switch assumes a second state in which the current at the current switch output is essentially equal to the current at the second current switch input.

2. An emitter-coupled logic output stage as in claim 1, wherein the second current switch base is connected to a predetermined reference voltage.

3. An emitter-coupled logic output stage as in claim 1, further comprising:

a second switch control transistor having a second switch control collector, a second switch control base, and a second switch control emitter;

a second level shifting diode having a second level shifting diode input and a second level shifting diode output; and a second switch control current source having a second switch control current source intake and a second switch control current source output;

wherein the second switch control base is connected to the second pullup base, the second switch control emitter is connected to the second level shifting diode input, and the second level shifting diode output is connected to the second current switch base and the second switch control current source intake.

4. An emitter coupled logic output stage as in claim 3, further comprising:

a first swing adjustment current source having a first swing adjustment current source intake and a first swing adjustment current source output; and a second swing adjustment current source having a second swing adjustment current source intake and a second swing adjustment current source output;

wherein the first swing adjustment current source intake is connected to the first pullup base and the first switch control base; and wherein the second swing adjustment current source intake is connected to the second pullup base and the second switch control base.

5. An emitter coupled logic output stage as in claim 3, further comprising:

a first differential resistor having a first differential resistor positive terminal and a first differential resistor negative terminal; and a second differential resistor having a second differential resistor positive terminal and a second differential resistor negative terminal;

wherein the first differential resistor negative terminal is connected to the first pullup base and the first switch control base; and wherein the second differential resistor negative terminal is connected to the second pullup base and the second switch control base.

6. An emitter-coupled logic output stage as in claim 5, further comprising:

a swing adjustment resistor having first and second swing adjustment resistor terminals;

wherein the first swing adjustment resistor terminal is connected to the first differential resistor negative terminal, and the second swing adjustment resistor terminal is connected to the second differential resistor negative terminal.

7. An emitter coupled logic output stage as in claim 5, further comprising:

a swing adjustment resistor having a swing adjustment resistor positive terminal and a swing adjustment resistor negative terminal;

wherein the swing adjustment resistor negative terminal is connected to the first differential resistor positive terminal and the second differential resistor positive terminal.

8. An emitter-coupled logic output stage as in claim 2, wherein the predetermined reference voltage is between approximately negative two and approximately negative three times a forward biased diode voltage.

9. An emitter coupled logic output stage as in claim 8, wherein the predetermined reference voltage is approximately −2.0 volts.

10. An emitter-coupled logic circuit, comprising:

a first differential resistor having a first differential resistor positive terminal and a first differential resistor negative terminal;

a second differential resistor having a second differential resistor positive terminal and a second differential resistor negative terminal;

a pullup transistor having a pullup collector, a pullup emitter, and a pullup base;

a level shifter having a level shifter input and a level shifter output, such that the level shifter output is a predetermined voltage lower than the level shifter input;

a latch having a latch input and a latch output;

a current switch having a current switch intake, a current switch output, and a current switch control input, such that the current switch intake carries no current when the current switch control input is below a threshold voltage and carries a current when the current switch control input is above a threshold voltage;

a pull down current source having a pull down current source intake and a pull down current source output; and an emitter coupled logic differential transistor pair having an ECL input signal as input and first and second differential signals as outputs;

wherein the first differential signal is connected to the first differential resistor negative terminal and the pullup base;

wherein the second differential signal is connected to the second differential resistor negative terminal and the level shifter input;

wherein the level shifter output is connected to latch input;

wherein the latch output is connected to the current switch control input; and wherein the pullup emitter is connected to the pull down current source intake and the current switch intake.

11. An emitter coupled logic circuit as in claim 10, wherein the predetermined voltage is approximately twice a forward-biased diode voltage.

12. An emitter coupled logic circuit as in claim 11,
wherein the threshold voltage is between approximately negative twice and approximately negative three times a forward-biased diode voltage.

13. An emitter coupled logic circuit as in claim 12,
wherein the threshold voltage is approximately negative 2.5 times a forward-biased diode voltage.

14. An emitter coupled logic circuit as in claim 10,
wherein the current is greater than the pull down current source.

15. An emitter coupled logic circuit as in claim 14,
wherein the current is more than twice the pull down current source.

16. An emitter coupled logic circuit as in claim 15,
wherein the current is approximately seven times the pull down current source.

17. An emitter coupled logic circuit as in claim 10,
wherein the level shifter is a capacitor.

18. An emitter-coupled logic circuit, comprising:

a first differential resistor having a first differential resistor positive terminal and a first differential resistor negative terminal;

a second differential resistor having a second differential resistor positive terminal and a second differential resistor negative terminal;

a pullup transistor having a pullup collector, a pullup emitter, and a pullup base;

a level shifter having a level shifter input and a level shifter output, such that the level shifter output is a predetermined voltage lower than the level shifter input;

a single-shot having an input and for generating a predetermined time duration output in response to the input;

a current switch having a current switch intake, a current switch output, and a current switch control input, such that the current switch intake carries no current when the current switch control input is below a threshold voltage and carries a current when the current switch control input is above a threshold voltage;

a pull down current source having a pull down current source intake and a pull down current source output; and an emitter coupled logic differential transistor pair having an ECL input signal as input and first and second differential signals as outputs;

wherein the first differential signal is connected to the first differential resistor negative terminal and the pullup base;

wherein the second differential signal is connected to the second differential resistor negative terminal and the level shifter input;

wherein the level shifter output is connected to the input of said single-shot;

wherein the output of the single-shot is connected to the current switch control input; and wherein the pullup emitter is connected to the pull down current source intake and the current switch intake.

19. An emitter coupled logic circuit as in claim 18,
wherein the predetermined time duration is a time required to discharge an output capacitance connected to the pullup emitter.

20. An emitter coupled logic circuit as in claim 18,
wherein the level shifter output is a predetermined voltage lower than the level shifter input.

21. An emitter coupled logic circuit as in claim 18,
wherein the level shifter is a capacitor.

22. An emitter coupled logic circuit as in claim 18,
wherein the level shifter is a diode.

* * * * *